United States Patent
Baldischweiler et al.

(10) Patent No.: US 9,316,674 B2
(45) Date of Patent: Apr. 19, 2016

(54) METHOD FOR CHECKING AN ANTENNA COIL

(75) Inventors: Michael Baldischweiler, Munich (DE); Klaus Finkenzeller, Unterfohring (DE); Carsten Bohn, Munich (DE)

(73) Assignee: GIESECKE & DEVRIENT GMBH, Munich (DE)

(*) Notice: Subject to any disclaimer, the term of this patent is extended or adjusted under 35 U.S.C. 154(b) by 0 days.

(21) Appl. No.: 14/342,869

(22) PCT Filed: Sep. 5, 2012

(86) PCT No.: PCT/EP2012/003728
§ 371 (c)(1),
(2), (4) Date: Mar. 5, 2014

(87) PCT Pub. No.: WO2013/034293
PCT Pub. Date: Mar. 14, 2013

(65) Prior Publication Data
US 2014/0225791 A1 Aug. 14, 2014

(30) Foreign Application Priority Data
Sep. 8, 2011 (DE) .......................... 10 2011 112 873

(51) Int. Cl.
*G01R 29/10* (2006.01)
*G06K 7/00* (2006.01)
(Continued)

(52) U.S. Cl.
CPC .............. *G01R 29/10* (2013.01); *G06K 7/0095* (2013.01); *H01Q 1/2225* (2013.01); *H01Q 7/00* (2013.01)

(58) Field of Classification Search
USPC ............................. 343/703, 866, 895, 700 MS
See application file for complete search history.

(56) References Cited

U.S. PATENT DOCUMENTS

| | | | |
|---|---|---|---|
| 2,887,650 A | 5/1959 | Ruddock et al. | |
| 3,659,197 A | 4/1972 | Alley et al. | |
| 6,236,220 B1 * | 5/2001 | Enguent | 324/652 |

FOREIGN PATENT DOCUMENTS

| | | | |
|---|---|---|---|
| DE | 10117249 A1 | | 11/2002 |
| DE | 102008004772 | * | 7/2009 |
| DE | 102008004772 A1 | | 7/2009 |

OTHER PUBLICATIONS

Finkenzeller, "RFID Handbuch Grudlagen und Praktische Anwendungen von Transpondern, Kontaktlosen Chipkarten und NFC," 5th edition, Chapter 4.1.6, pp. 80-82, 2008, Carl Hanser Verlag, Munich. Published in English under Finkenzeller, "RFID Handbook Fundamentals and Applications in Contactless Smart Cards, Radio Frequency Identification and Near-Field Communication," 3rd Edition, Chapter 4.1.6, pp. 70-72, 2010, John Wiley & Sons Ltd., Chichester, GB.

(Continued)

*Primary Examiner* — Sue A Purvis
*Assistant Examiner* — Jae Kim
(74) *Attorney, Agent, or Firm* — Workman Nydegger

(57) ABSTRACT

A method for contactlessly checking the functionality of an antenna coil for a portable data carrier comprises the steps of exciting the antenna coil, detecting the free, damped oscillation of the antenna coil in response to the excitation, and evaluating the detected free, damped oscillation. The excitation of the antenna coil is effected inductively through a pulsed magnetic field, which may be generated by a single direct-current pulse, such as a Dirac pulse, by means of an exciting coil attached to a pulse generator. The detection of the oscillation of the antenna coil is effected through a measuring antenna, and the evaluation is effected by means of an evaluation device connected to the measuring antenna.

14 Claims, 21 Drawing Sheets

(51) Int. Cl.
*H01Q 1/22* (2006.01)
*H01Q 7/00* (2006.01)

(56) References Cited

OTHER PUBLICATIONS

Finkenzeller, "RFID Handbuch Grudlagen und Praktische Anwendungen von Transpondern, Kontaktlosen Chipkarten und NFC," 5th edition, Chapter 4.1.9.2, pp. 94-95, 2008, Carl Hanser Verlag, Munich. Published in English under Finkenzeller, "RFID Handbook Fundamentals and Applications in Contactless Smart Cards, Radio Frequency Identification and Near-Field Communication," 3rd Edition, Chapter 4.1.9.2, pp. 82-83, 2010, John Wiley & Sons Ltd., Chichester, GB.

Finkenzeller, "RFID Handbuch Grudlagen und Praktische Anwendungen von Transpondern, Kontaktlosen Chipkarten und NFC," 5th edition, Chapter 4.1.11.2, pp. 115-119, 2008, Carl Hanser Verlag, Munich. Published in English under Finkenzeller, "RFID Handbook Fundamentals and Applications in Contactless Smart Cards, Radio Frequency Identification and Near-Field Communication," 3rd Edition, Chapter 4.1.11.2, pp. 102-106, 2010, John Wiley & Sons Ltd., Chichester, GB.

German Search Report for corresponding German Application No. 102011112873.9, created on Jun. 28, 2012.

International Search Report for corresponding International PCT Application No. PCT/EP2012/003728, mailed Dec. 13, 2012.

\* cited by examiner

METHOD FOR CHECKING AN ANTENNA COIL

BACKGROUND

The present invention relates to a method for checking the functionality of an antenna coil for a portable data carrier, to a corresponding checking apparatus and to an apparatus for manufacturing an antenna coil.

SUMMARY

Portable data carriers, such as for example national identity cards, passports, credit cards, labels for authenticating goods or the like, can be assembled with an antenna coil for contactless data communication with a reading device. The antenna coil is for this purpose normally connected to an integrated circuit of the data carrier, in particular a chip, and applied, for example imprinted, on a carrier layer or inlay layer, for example made of a plastic material such as PC or PVC, of a data-carrier body of the data carrier.

To check the functionality of an antenna coil during or after the manufacture of the corresponding data carrier, various methods are known. Such a check is substantially aimed at checking whether the antenna coil has a break and/or whether two or more coil turns of the antenna are inadvertently short-circuited. Defects of this nature considerably impair the functionality of the antenna coil, or destroy it completely.

An in-process check of the antenna coil is usually effected in the form of a direct-current resistance measurement. To carry out such an ohmic measurement correctly and with the required accuracy, a four-point measurement is normally required. If the measured values are outside a stipulated interval, this can indicate a conducting path break or a short circuit. However, such a method can only be used to determine the ohmic portion of the antenna coil. In this way it is not possible to determine a frequency-dependent impedance of the coil, consisting of the inductance of the coil, the ohmic portion and a capacitive portion which can also come from a carrier material. Further, this checking method is elaborate, because a contacting of the antenna coil is required. When the antenna coil is manufactured by means of a printing process, for example imprinted by means of silver conductive paste, it can moreover happen that the paste is not yet completely cured upon the resistance measurement, and corresponding contact pins which are employed for contacting are contaminated and subsequently have to be cleaned or replaced.

Alternatively, the resonance frequency of the antenna coil and its quality factor can be determined contactlessly. For this purpose, a phase and impedance analyzer is normally employed. Such a, very elaborate, method is described in detail for example in "RFID-Handbuch" by Klaus Finkenzeller, 5th edition, Carl Hanser Verlag, Munich, 2008, in chapter 4.1.11.2. If the measured resonance frequency is within a stipulated range, the antenna coil is functional. This kind of check is more informative than a strictly ohmic measurement, but is far more elaborate and best carried out manually. The time duration of such a check is in the range of several seconds. Hence, this check is normally not carried out in-process, but only on some random samples and for production release.

Finally, when an antenna coil of a transponder is checked, the antenna thus already being connected to the corresponding integrated circuit, the responsiveness of the transponder can be tested. Such a check is not always informative, even when it turns out positive, because slight defects of the antenna coil, such as for example hair cracks in a conducting path, result only in a damping and thus only a lower read range. This usually does not impair the general responsiveness of the transponder in the test. However, such defects are often a reason for early failures of the data carrier after it is issued to a user and should hence already be recognized upon the check.

The object of the present invention is therefore to propose a method and an apparatus for checking an antenna coil with regard to its functionality in a manner that is fast, easily carried out and cost-efficient. It is desirable for a result of the check to be profitably employable upon the further manufacture of the antenna coil.

This object is achieved by a method and a checking apparatus as well as an apparatus for manufacturing an antenna coil having the features of the independent claims. Advantageous embodiments and developments of the invention are stated in the dependent claims.

The basic idea of the present invention consists in exciting the antenna coil to be checked to oscillate, and detecting and evaluating the free, damped oscillation of the antenna coil generated by the excitation, in order to recognize any defects of the antenna coil.

Therefore, a method according to the invention for checking the functionality of an antenna coil for a contactlessly communicating portable data carrier comprises the following steps:

In a first step, the antenna coil is excited to oscillate. This is preferably done inductively through a pulsed magnetic field, which can be generated for example in simple manner by a single direct-current pulse. Preferably, the excitation consists of a single magnetic-field pulse. The direct-current pulse can be generated advantageously as a Dirac impulse function. It is also possible that the magnetic field is generated by a (direct-) current pulse which, unlike a Dirac impulse function, only has one steep edge. Preferably, the exciting of the antenna coil is effected contactlessly via an exciting coil which for this purpose is coupled to a corresponding pulse generator.

In a second step of the method according to the invention, the free, damped oscillation of the antenna coil which is generated in response to the excitation is detected. This is preferably likewise done contactlessly by means of a measuring antenna. Exciting coil and measuring antenna are for this purpose advantageously disposed in direct proximity of the antenna coil to be checked.

In a third step, the detected free, damped oscillation of the antenna coil is evaluated. This can be done by means of a suitable evaluation device which is connected to the measuring antenna.

A checking apparatus, according to the invention, for checking the functionality of the antenna coil for a contactlessly communicating portable data carrier thus comprises a pulse generator. The latter is arranged to excite the antenna coil to oscillate contactlessly via an exciting coil attached to the pulse generator. Further, the checking apparatus comprises a measuring antenna which is arranged to contactlessly detect a free, damped oscillation of the antenna coil. Finally, an evaluation device of the checking apparatus, which is connected to the measuring antenna, is arranged to evaluate the free, damped oscillation detected by the measuring antenna.

The evaluation device can, in so doing, in particular draw on a comparison with reference values of an intact antenna coil. For analyzing the signals detected by the measuring antenna upon detection of the free, damped oscillation there can be used in the known way for example a digital signal processor (DSP) or an oscilloscope.

The antenna coil excited in the described manner dies out after excitation immediately with a free, damped oscillation A(t) which can be described by the following formula:

$$A(t)=A_0(t)e^{(-\delta t)}\cos \omega t$$

A(t) can correspond to the current I or the voltage U of an electrical oscillating circuit formed by the antenna coil. Therefore, the voltage pattern of the antenna coil immediately after excitation can be described by the following formula:

$$U(t)=U_0(t)e^{(-\delta t)}\cos \omega t$$

The circular frequency ω corresponds here to the self-resonant frequency of the antenna coil. From the decay coefficient δ the quality factor of the antenna coil can be established. The longer the decay phase lasts, the higher the quality factor of the corresponding oscillating circuit is. That is to say, an evaluation of the free damped oscillation of the antenna coil, i.e. its dying out immediately after excitation, allows both the self-resonant frequency and the quality factor of the antenna coil to be determined.

The invention is now based on the fact that a defect of the antenna coil to be checked, such as for example an interruption of a conducting path or a short circuit between individual coil turns of the antenna coil, has the result that a dying-out signal pattern recognizable upon a described check differs significantly from a corresponding dying-out signal pattern of an intact antenna coil. Parameters of a faulty coil that are ascertained on the basis of the evaluated free, damped oscillation, in particular the antenna's self-resonant frequency and its quality factor, differ clearly from the corresponding parameters of an intact antenna coil.

A conducting path break, for example, becomes apparent in a clearly recognizable change in dying-out behavior, in particular a changed, normally elevated, self-resonant frequency. In the case of a short circuit of two or more coil turns, there is hardly any more dying out to be observed.

In this way, upon evaluation of the free, damped oscillation by the checking apparatus, it can not only be recognized whether or not the antenna coil is faulty but, in the case of a fault or defect, it also possible to ascertain the type of fault or the nature of the defect.

The advantages of the method according to the invention are evident and numerous. The check of the antenna coil can be carried out contactlessly, with very little time expenditure and thus in particular during an ongoing production process. In particular, a printed antenna coil that is not yet completely cured can already be checked with the method according to the invention. The required checking apparatus can be provided relatively simply and cost-efficiently. Moreover, the method allows not only faults or defects of a defective antenna coil to be recognized, but also different types of faults to be distinguished. The method furthermore allows, without changing the setup, a check of both unassembled antenna coils, i.e. those not yet connected to an integrated circuit, and antenna coils with a circuit attached, such as for example already finished transponders or contactlessly communicating chip cards. Finally, the method can be carried out in parallel for a plurality of antennas that are disposed for example side by side on a production sheet, without any shielding of individual antennas being necessary. Altogether, antenna coils can thus be checked with regard to their functionality fast, in a simple manner and cost-efficiently.

Preferably, the exciting coil and the measuring antenna are disposed "orthogonally" to each other for checking the antenna coil or in the checking apparatus. In the case that the exciting coil and the measuring antenna are not disposed orthogonally to each other, but for example side by side, the exciting pulse of the exciting coil is also detected by the measuring antenna. Moreover, the exciting coil's decay behavior is then superimposed on the antenna coil's decay behavior to be measured.

Upon an "orthogonal" arrangement of the exciting coil relative to the measuring antenna, the two lie relative to each other such that the signal of the exciting coil is not perceived by the measuring antenna. The exciting coil is so disposed spatially vis-à-vis the measuring antenna that substantially no signal is coupled into the measuring antenna. A signal is always coupled into a coil when the contour integral over the magnetic flux Φ through this coil is greater than zero (cf. above-cited "RFID-Handbuch", chapters 4.1.6 and 4.1.9.2). The integral over the magnetic flux Φ is zero exactly when magnetic field lines of different direction and field strength in the measuring antenna cancel each other out across the total area, or when the angle of the field lines to the coil axis amounts to exactly 90°—hence the term "orthogonal" arrangement. A suitable so-called coplanar orthogonal arrangement of the exciting coil relative to the measuring antenna, as will be described more precisely hereinafter, can be effected for example such that the two antennas lie partly one over the other suitably in a plane.

The measuring antenna is preferably so designed that the quality factor of the measuring antenna is as small as possible and the input capacitance of a possibly attached amplifier cannot take effect if possible, because the measuring antenna itself can otherwise bring a strong self-oscillation into the measurement. Such an unwanted self-resonance of the measuring antenna can be suppressed for example by means of a compensation circuit described more precisely hereinafter.

Depending on the nature of a defect ascertained by the checking apparatus when checking the antenna coil, it can be provided that at least one production parameter for manufacturing the antenna coil is newly determined. When the antenna coil is for example printed upon manufacture, such a parameter can relate for example to the metering of the conductive paste to be printed, the width of a conducting path to be printed, the number of coil turns, or the like. A newly determined production parameter can help as feedback in the ongoing production to optimize the same and to prevent the manufacture of a great number of defective antenna coils.

Alternatively or additionally, an antenna coil recognized as defective can be "repaired" or optimized in a further step. This can be done by subsequently disposing, in particular printing, missing conducting path portions, by overprinting existing conducting path portions, or by removing unneeded portions of existing conducting path structures, in order to correct or adjust the antenna coil with regard to stipulated physical parameters, such as for example its ohmic resistance, in the post-processing step.

Accordingly, an apparatus according to the invention for manufacturing an antenna coil on a carrier material for a contactlessly communicating portable data carrier comprises a device for manufacturing an antenna coil on the carrier material, for example a printing apparatus. Further, the production apparatus comprises a checking apparatus according to the invention for checking the antenna coil in the way described in detail hereinabove.

As mentioned, the evaluation device of the checking device is preferably arranged to newly determine, in dependence on the nature of an ascertained defect of the antenna coil, at least one production parameter for manufacturing further antenna coils.

Further, the production apparatus is preferably arranged to post-process in a further step, as described hereinabove, an antenna coil ascertained as defective after the check of the antenna coil by the checking apparatus.

The method according to the invention can be used to check an unassembled antenna coil, i.e. an open or closed antenna coil without an integrated circuit attached, or a transponder in the form of the antenna coil with an integrated circuit attached.

According to a preferred embodiment of the checking method, the functionality is checked on a closed antenna coil which is not yet connected to an integrated circuit. The antenna coil can have already been manufactured as a closed antenna coil from the outset, or first be present as an open antenna coil which is made into a closed antenna coil by bridging the ends of the open antenna coil before checking Subsequently, i.e. after checking, a conducting path of the antenna coil is interrupted for manufacturing an open antenna coil according to this preferred embodiment, so that the open ends of the antenna coil can be connected to components of an integrated circuit, in particular a chip.

This preferred embodiment makes it possible in a simple manner to recognize faults, in particular line breaks, in an antenna coil that occur very close to the contacting ends of the coil. Conventional contactless checking methods which are not carried out on closed, but on open, antenna coils do not, or hardly, recognize such faults due to their inherent principle, since the physical properties of a part of such a faulty antenna coil, if the part is only large enough, are hardly distinguishable from the physical properties of an intact coil, since the corresponding line lengths are not sufficiently different from each other.

If a conducting path break was present in the original antenna coil without a chip, no matter at what point, i.e. also close to one of the contacting ends of the antenna coil, the coil that is now changed, i.e. short-circuited by bridging of the contacting ends, is still open and hence clearly distinguishable from an intact coil, which should now be closed due to the bridging. The dying-out behavior of a coil closed as described is unmistakable in comparison to an open coil.

According to a development of this preferred embodiment, the step of checking the antenna coil is repeated after the interrupting of the coil and before the attaching of the chip. In this way it is then also possible to reliably recognize other defects of the antenna coil, in particular a short circuit between individual coil turns.

BRIEF DESCRIPTION OF THE DRAWINGS

The invention will described by way of example hereinafter with reference to the attached drawings. Therein are shown.

DETAILED DESCRIPTION OF VARIOUS EMBODIMENTS

Figure 1:
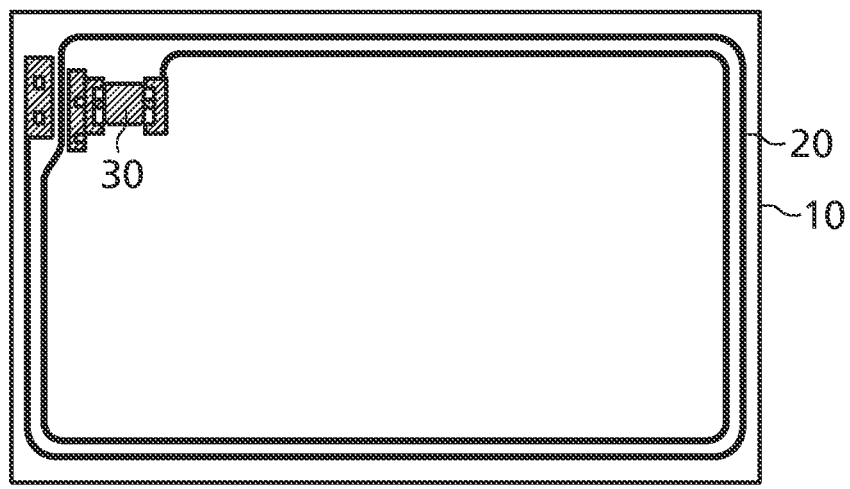
FIGS. 1, 2 a respective antenna coil to be checked on a carrier layer.
Figure 2:
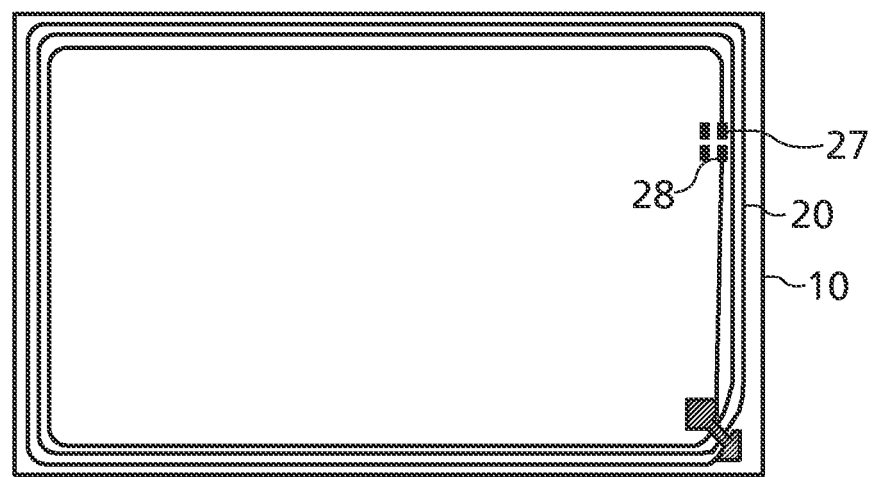

FIGS. 1 and 2 show two different inlay layers 10 of a portable data carrier, in the shown example a chip card, having an antenna coil 20 disposed thereon. The antenna coil 20 can be applied on both sides, in which case a feedthrough is necessary for forming a crossing point. In the case of an antenna coil applied to only one side, as shown in FIG. 2, a crossing is formed by means of a bridge (bottom right of the figure). On the carrier layer 10 in FIG. 1 an integrated circuit 30 has already been connected to the antenna coil 20, while the antenna coil 20 in FIG. 2 is open and as yet unassembled. The ends 27, 28 of the open antenna coil 20 are provided as contact points for later contacting of the circuit 30.

Figure 3:
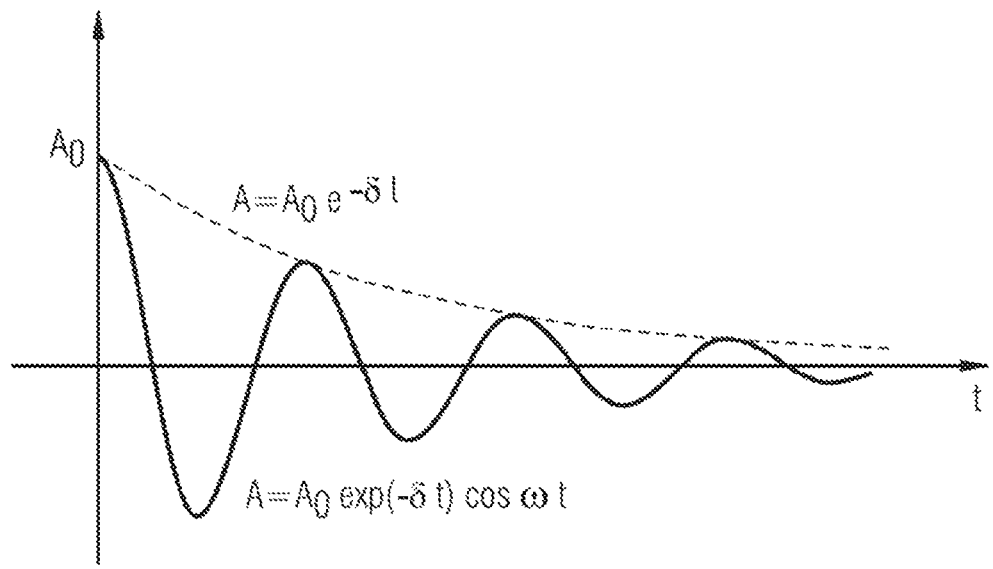
FIG. 3 the pattern of a free, damped oscillation.

FIG. 3 shows the theoretical pattern of a free, damped oscillation A(t) in the course of time t. A(t) can correspond to the current I or the voltage U. The circular frequency ω corresponds to the self-resonant frequency of the corresponding coil, while the quality factor of the coil can be determined from the decay coefficient δ.

Here and in the following, only the term "coil" or "antenna coil" will always be employed for reasons of simplicity both for designating an unassembled antenna coil, i.e. an antenna coil without a circuit connected thereto, and for designating a transponder, i.e. an antenna coil with a circuit already connected, unless otherwise indicated by the context.

Figure 4:
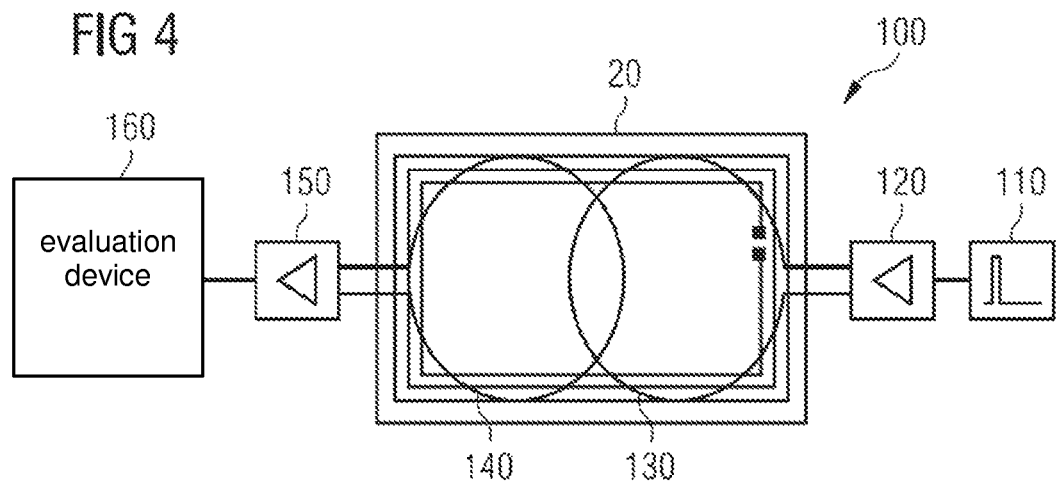
FIG. 4 components of a first embodiment of a checking apparatus according to the invention.

FIG. 4 shows schematically the structure of a checking apparatus 100 for checking an antenna coil 20. The apparatus 100 comprises a pulse generator 110 with an amplifier 120 attached. The output of the amplifier 120 is applied to an exciting coil 130 which preferably has only one turn. A measuring antenna 140 is disposed "orthogonally" to the exciting coil 130. On the measuring antenna 140, which preferably likewise possesses only one coil turn, there is again disposed an amplifier 150, whose output is attached to an evaluation device 160.

Within the framework of this invention, the term "orthogonal" arrangement of two coils to each other, here the exciting coil 130 and the measuring antenna 140, is so employed that the arrangement of the exciting coil 130 relative to the measuring antenna 140 is effected spatially such that no signal of the exciting coil 130 is coupled into the measuring antenna 140 if possible. As mentioned hereinabove, this is the case exactly when the contour integral over the magnetic flux Φ through this coil is greater than zero. The integral over the magnetic flux Φ is zero exactly when magnetic field lines of different direction and field strength in the measuring antenna 140 cancel each other out over the total area, or when the angle of the field lines to the coil axis amounts to exactly 90°. In the shown example, the exciting coil 130 and the measuring antenna 140 are disposed "orthogonally" to each other coplanarly, by the two coils being disposed partly one over the other, as represented. This arrangement can be further coordinated such that the integral over the magnetic flux yields zero, as desired. This follows from the magnetic field lines generated by the exciting coil 130 extending in respectively different directions inside and outside the exciting coil 130. The degree of overlap of the exciting coil 130 and the measuring antenna 140 is now so chosen that these field lines exactly cancel each other out in the inner surface of the measuring antenna 140. As described hereinafter with reference to FIGS. 15 to 19, an orthogonal arrangement of the exciting coil 130 relative to the measuring antenna 140 facilitates detection of the dying out of the antenna coil 20 to be checked.

Figure 5:
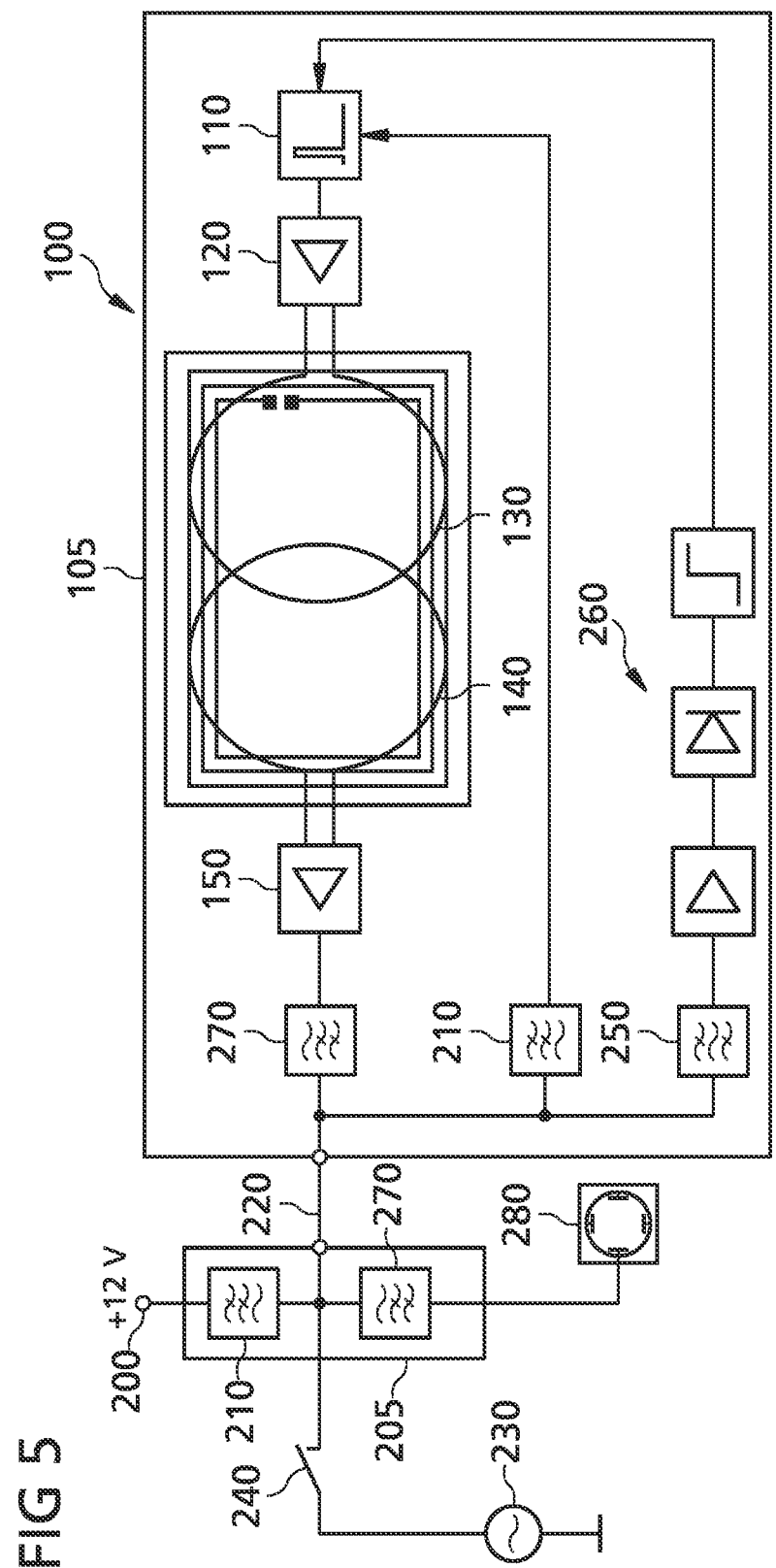
FIG. 5 a preferred embodiment of the checking apparatus from FIG. 4.

FIG. 5 shows a preferred embodiment 100' of the checking apparatus 100 from FIG. 4. In particular, the possibility is illustrated of transmitting a voltage supply for a measuring circuit, a trigger signal and the detected measurement signal via a single coaxial cable 220 between a measuring card 105 and an evaluation device, for example an oscilloscope 280. Via an adapter card 205 the supply voltage and a trigger signal are fed in, and a measurement signal coupled out. The following transmission channels are thereby formed, being guided via the coaxial cable 220:

A first transmission channel extends from a power pack 200 via a low-pass filter 210, the coaxial cable 220, and a further low-pass filter 210 to the voltage supply of the measuring card 105.

A second transmission channel starts at a signal generator 230 for a signal tone for triggering a pulse, in the shown example a Dirac pulse, extends via a trigger 240 in the form of a switch, optionally via a band-pass filter (not shown), the coaxial cable 220, a further band-pass filter 250, and an evaluation circuit 260 of the measuring card 105 to the pulse generator 110.

Finally, a third transmission channel extends from the measuring antenna 140 via the measurement amplifier 150 on the measuring card 105, a high-pass filter 270, the coaxial cable 220 and a further high-pass filter 270 to the oscilloscope 280.

Figure 6:
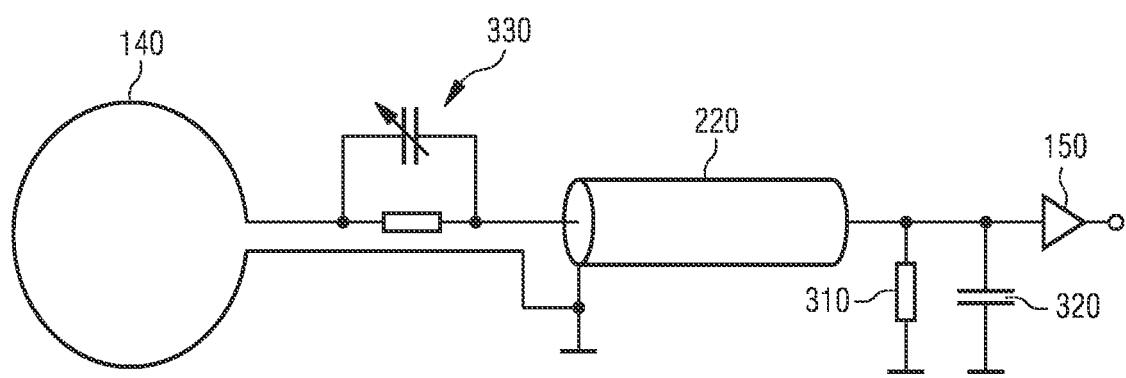
FIG. 6 a preferred embodiment of a portion of the checking apparatus from FIG. 5 with reference to a measuring antenna.

FIG. 6 shows a preferred design of the measuring antenna 140. This is such that the measuring antenna 140 has a quality factor as low as possible and that the input capacitance of the amplifier 150 attached via the coaxial cable 220 cannot take effect if possible, because the measuring antenna 140 would otherwise bring a strong self-oscillation into the measurement. This would impair the measurement, i.e. the detection of the free damped oscillation of the antenna coil 20 to be checked. In particular, the self-oscillation would always have to be eliminated. The figure shows input capacitance 320 and input resistance 320 of the amplifier 150. The self-resonance of the measuring antenna 140 can be suppressed by means of a compensation circuit 330. The latter consists of a parallel connection of a capacitance and a resistance, these quantities typically being in the range of approx. 1 to 50 pF or 1 to 10 MOhms. The compensation circuit 330 is in series with the measuring antenna 140. Through the high series resistance the quality factor of the measuring antenna 140 practically tends to zero. Thus, the self-resonance no longer takes effect. For calculating this compensation circuit 330 there can be employed for example the formulae known for calculating the compensation for oscilloscope probes.

Figure 7:
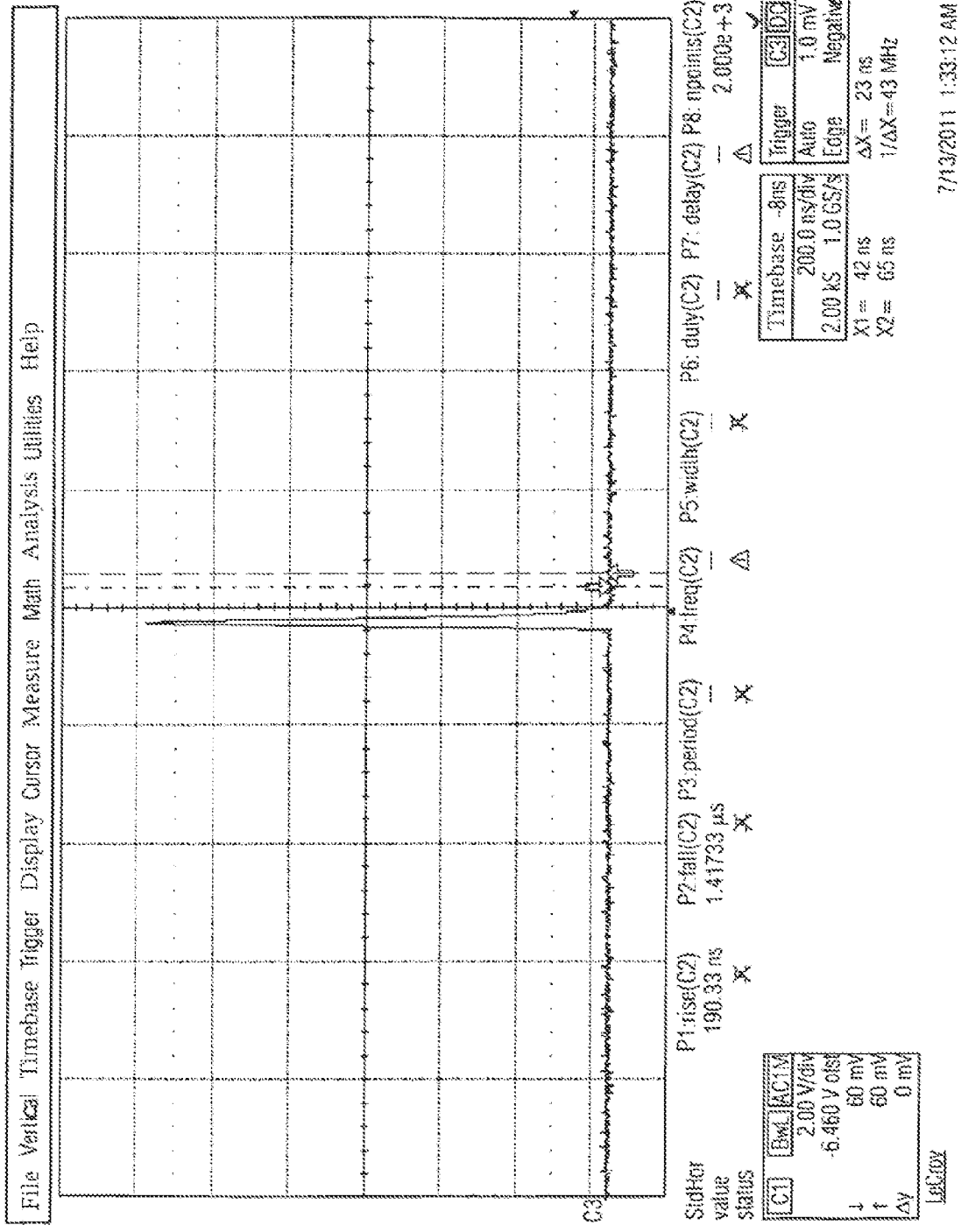
FIG. 7 a signal pattern of an exciting pulse of a pulse generator.

According to a first embodiment of the checking method, the antenna coil is excited by a Dirac pulse. For this purpose, the pulse generator 110 is adjusted so as to reach a maximum amplitude in the shortest possible time. For example, an amplitude of 12 V with a width of only 29 ns can be reached. FIG. 7 indicates a corresponding signal pattern.

Figure 8:
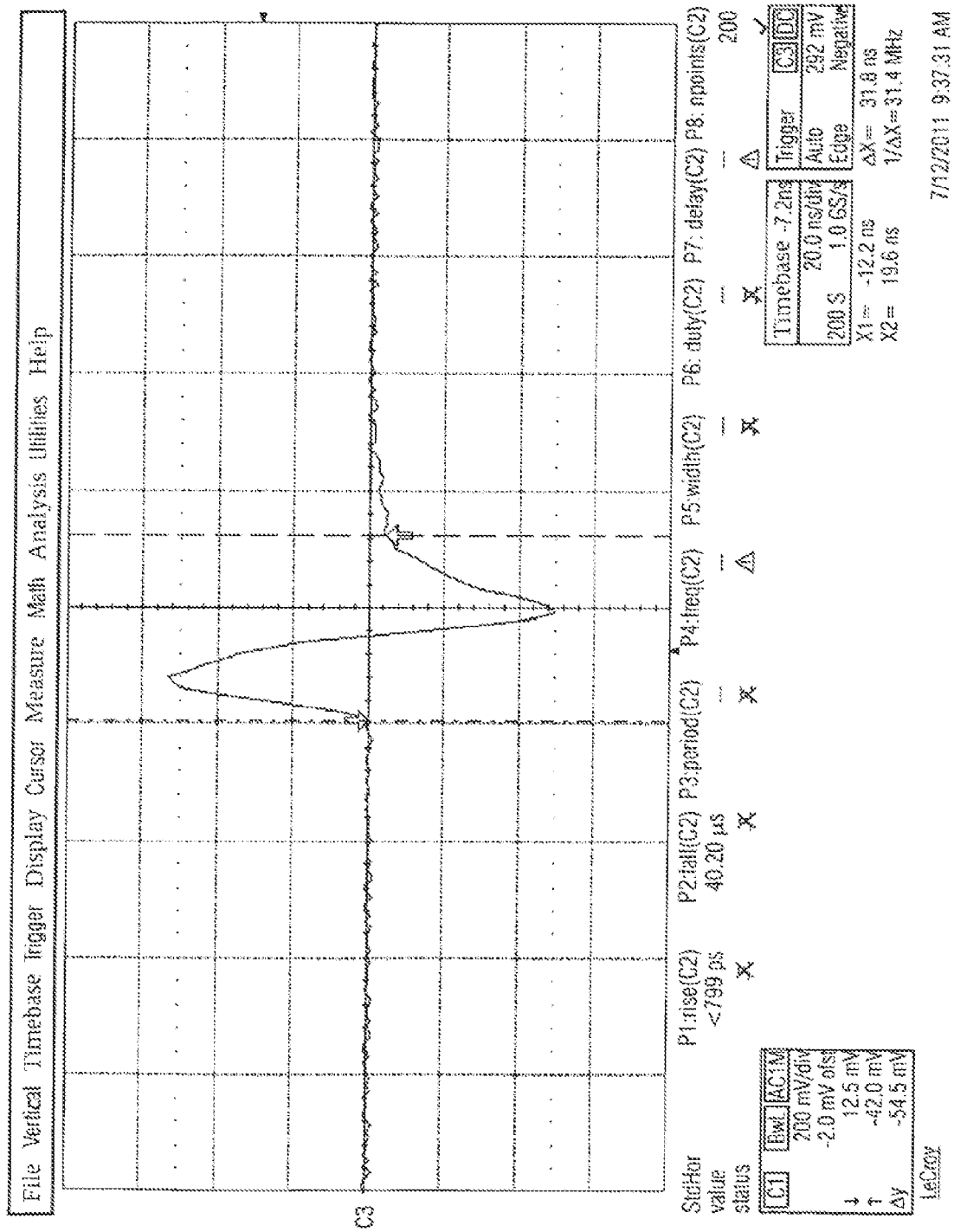
FIG. 8 a pattern of the signal of the exciting pulse with the exciting coil attached to the pulse generator.

When the pulse generator 110 is now attached to the exciting coil 130, there results—without arrangement of the antenna coil 20—through the energy arising in the thereby arising magnetic field a signal pattern with a subsequent dying-out time which is detected by the measuring antenna 140, as is illustrated in FIG. 8. The measuring antenna 140 is not disposed orthogonally to the exciting coil 140 here and with reference to the following FIGS. 9 to 14. The advantages of an orthogonal arrangement of these coils will be described with reference to FIGS. 15 to 19, as mentioned hereinabove.

When an antenna coil 20 to be checked is now disposed directly under the exciting coil 130, the antenna coil is excited by the positive Dirac pulse of the pulse generator 110 to a free, damped oscillation. From the resulting typical dying out of the antenna coil 20 the self-resonant frequency of the antenna coil 20 as well as its quality factor can be established. If the antenna coil 20 has a fabrication defect, for example a conducting path break or a short circuit between individual coil turns, this leads to a significantly deviating signal pattern of "post-oscillation", i.e. of the corresponding free, damped oscillation of the damaged antenna coil, as illustrated hereinafter. In particular, self-resonant frequency and/or quality factor of such a coil differ from the corresponding values of an intact antenna coil in a clearly recognizable way.

Figure 9:
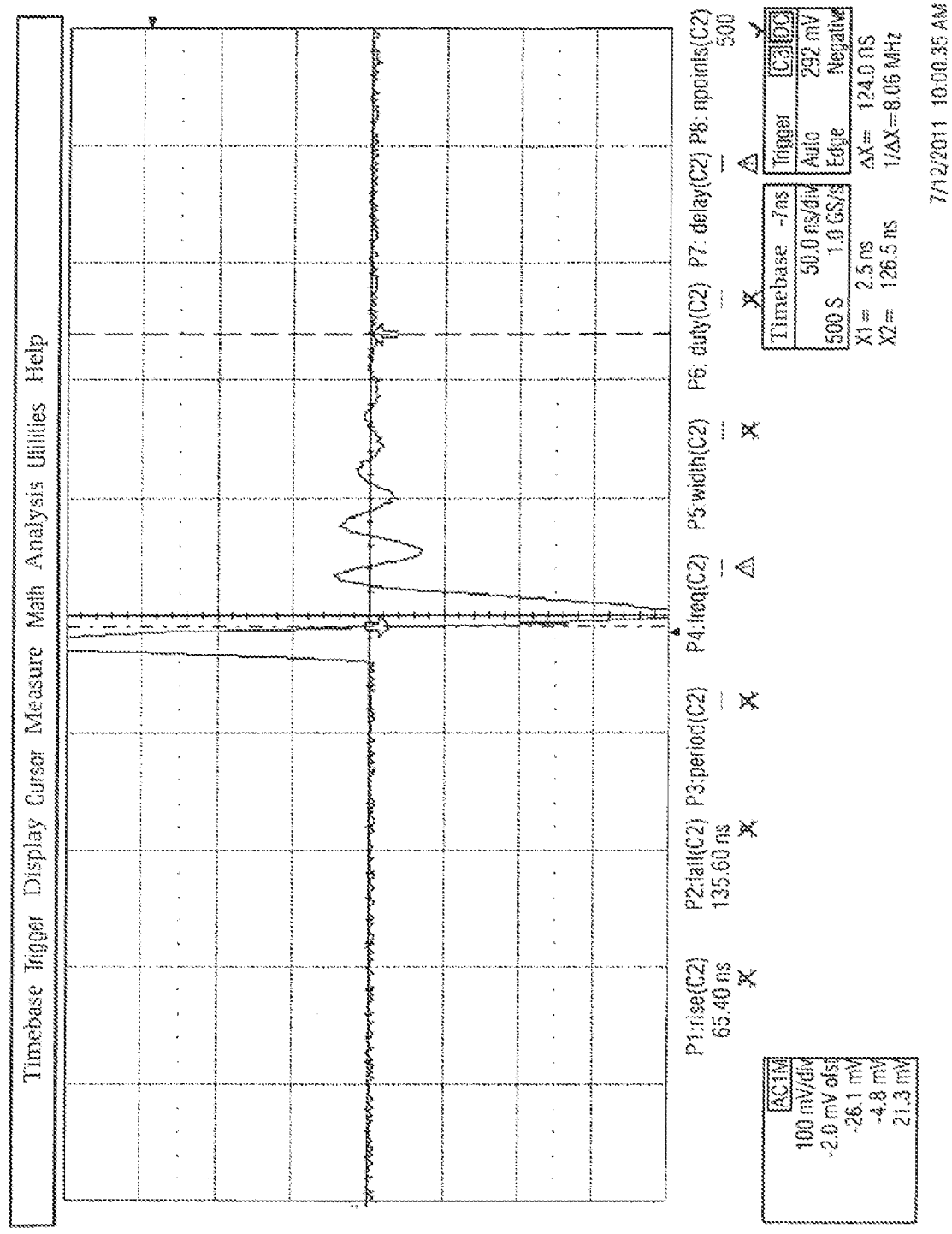
FIG. 9 a signal pattern of a free, damped oscillation of an intact antenna coil when the latter has been excited with a pulse according to FIG. 7.
Figure 10:
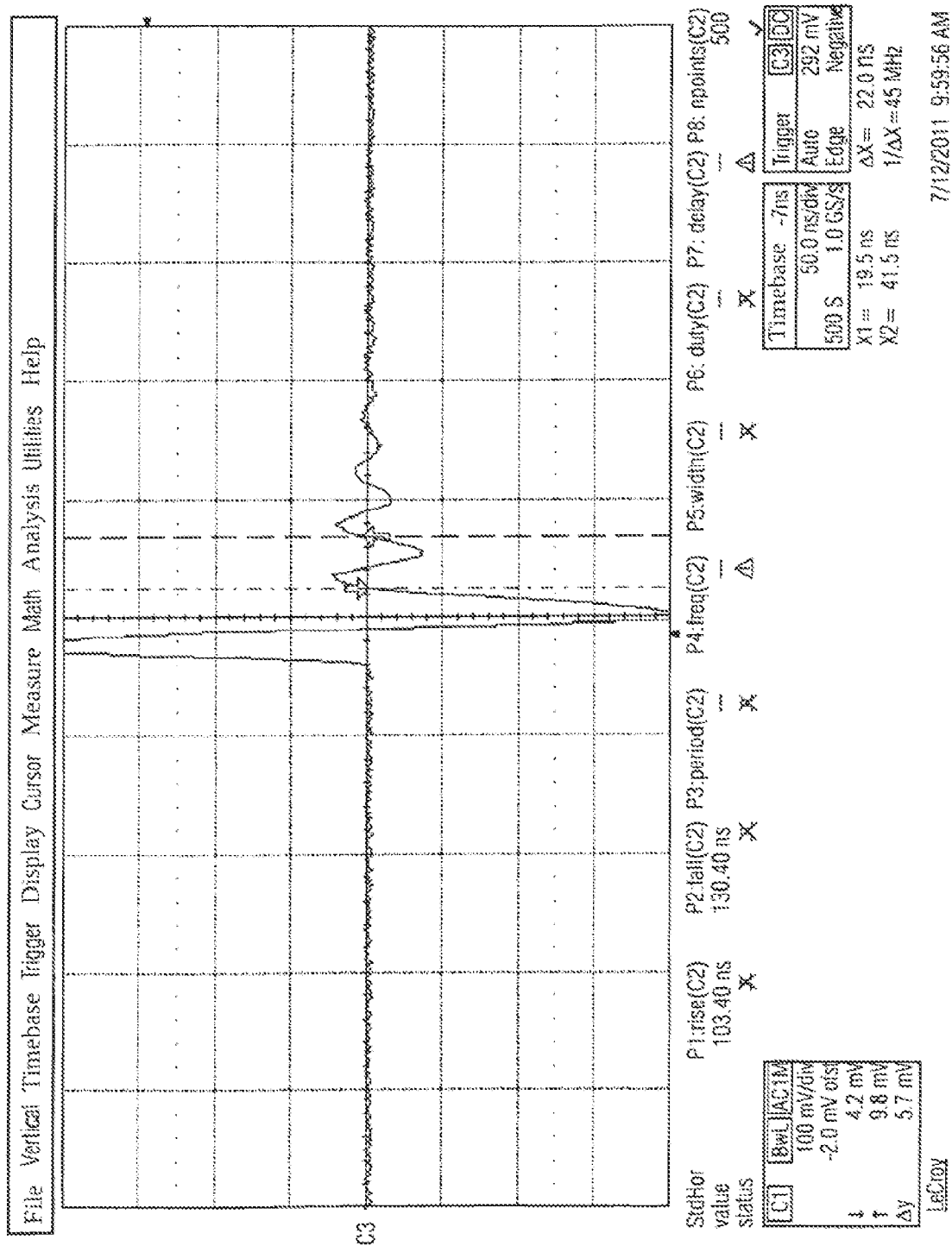
FIG. 10 a procedure for establishing the self-resonance of the antenna coil from FIG. 9 on the basis of an evaluation of the free, damped oscillation.

FIG. 9 represents the signal pattern of a free, damped oscillation of an intact antenna coil 20. FIG. 10 indicates by means of the arrows in the figure how the self-resonance of the checked coil can be determined on the basis of the detected signal pattern. The open antenna coil without a chip on which the measurement results in FIG. 10 are based possesses for example a self-resonant frequency of approx. 45 MHz.

A transponder, i.e. an antenna coil with an integrated circuit attached, normally possesses a self-resonant frequency in the order of magnitude of the transmitting frequency of an appurtenant reading device. Contactless chip cards according to ISO/IEC 14443 are usually tuned in the range of 15 to 17 MHz at a stipulated read frequency of 13.56 MHz.

An antenna coil, without an integrated circuit attached, on a corresponding carrier material likewise forms, together with the parasitic capacitances occurring between the turns, an oscillating circuit, usually with a self-resonant frequency in the range of 30 to 50 MHz, depending on the dielectric constant of the carrier material and the turns count.

Figure 11:
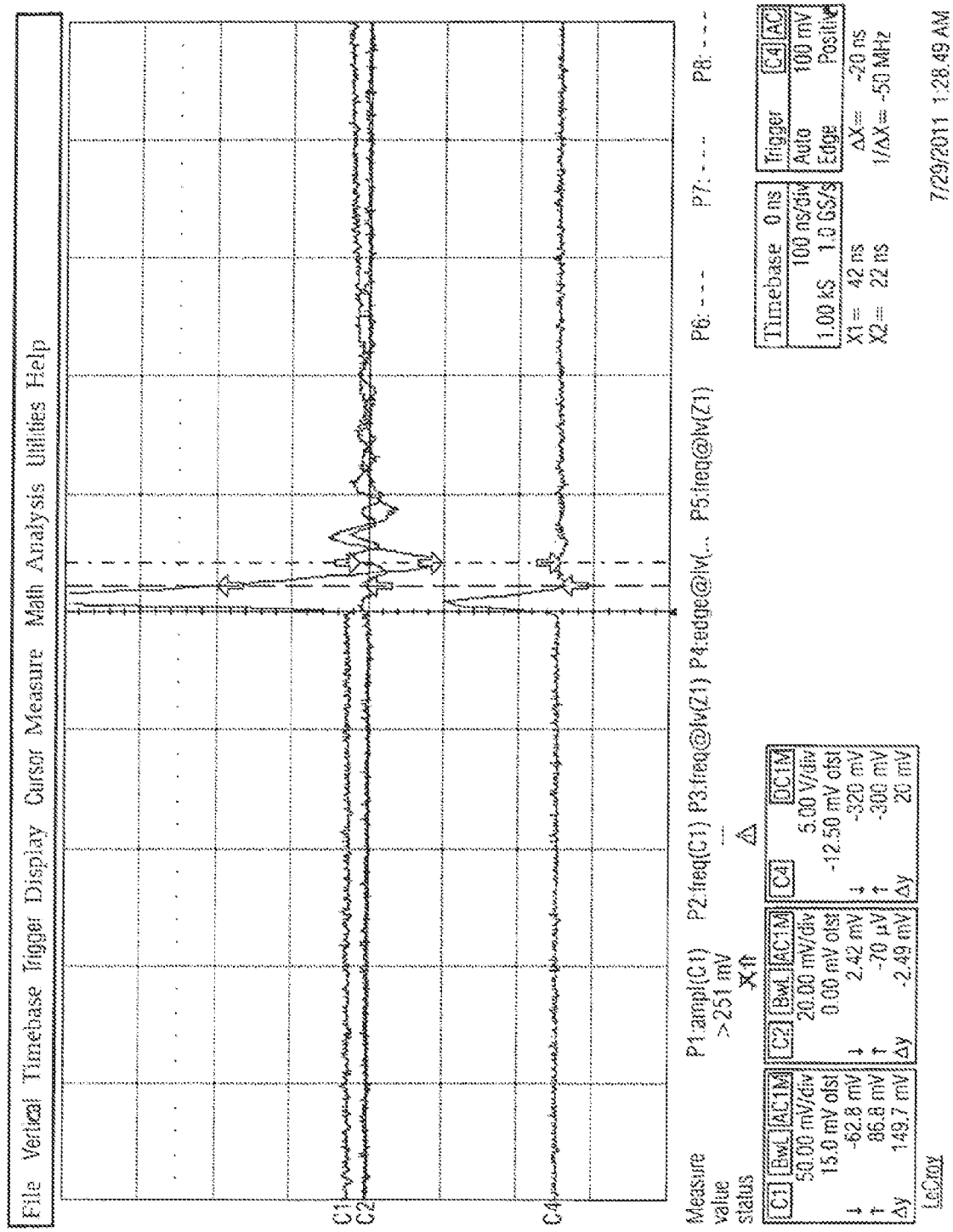
FIG. 11 a signal pattern of a free, damped oscillation of an intact antenna coil when the excitation has been effected by a pulse shown in FIG. 12.
Figure 12:
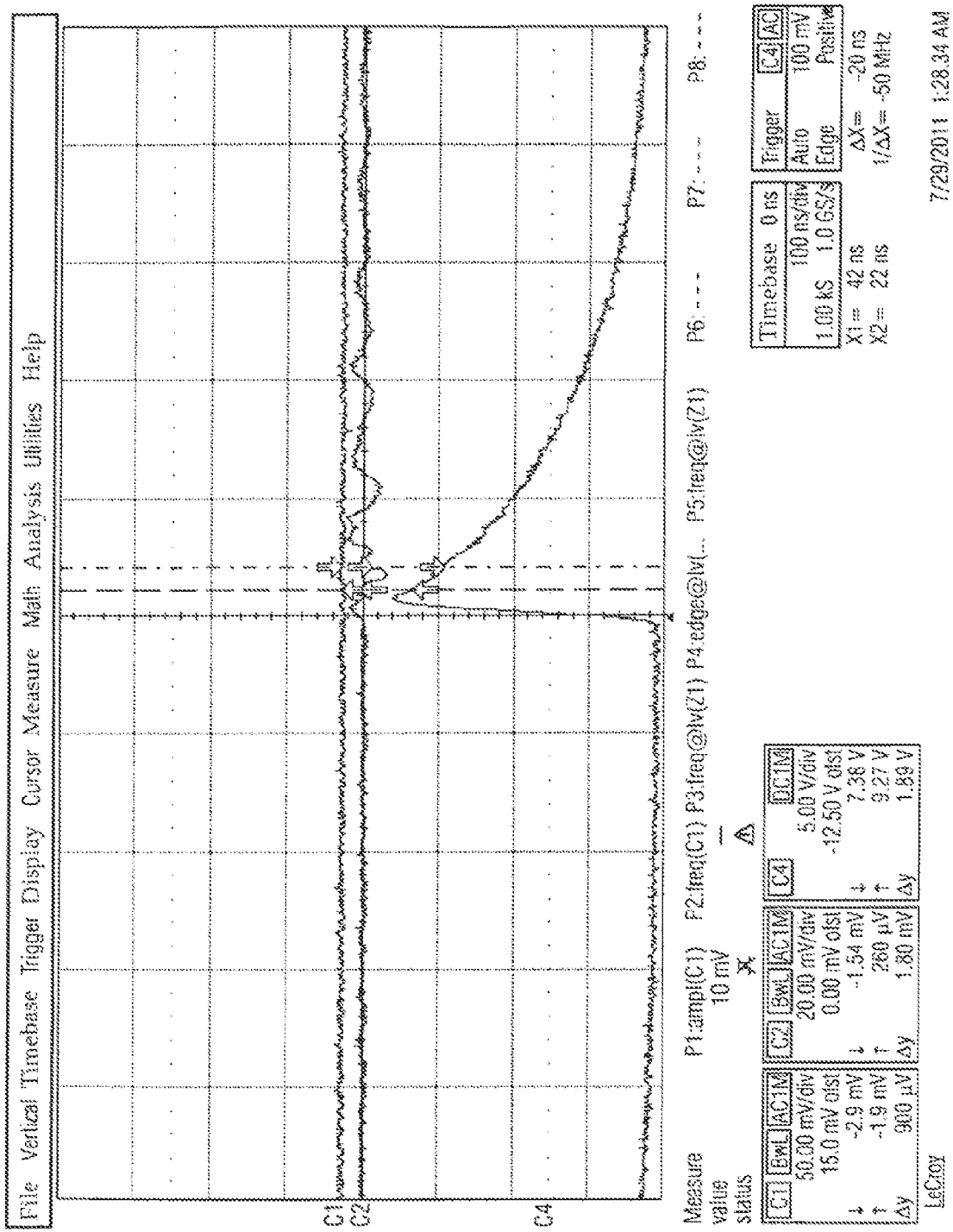
FIG. 12 an alternative excitation pulse which has only one steep edge, unlike the pulse from FIG. 7.

FIGS. 11 and 12 show what signal pattern results for an intact antenna coil 20 (FIG. 11) when there is employed for exciting the antenna coil 20, instead of a Dirac pulse (as represented in FIG. 7), a pulse having only one steep edge (FIG. 12). The second edge of the pulse drops exponentially in this example. In principle, each of the two edges can be provided as the steep edge. Such a pulse involves the advantage compared with a Dirac pulse that only one steep edge is required at the exciter, and that only one strong pulse in only one polarity is thus also generated in the antenna coil 20 to be checked (cf. FIG. 11). Such an exciting signal can thus prove advantageous since only energy in one direction (polarity) is brought into the antenna coil to be checked.

The signal patterns that will be described hereinafter with reference to FIGS. 13 to 19 are based on an excitation by a Dirac pulse in order to guarantee comparability with the signal patterns of FIGS. 7 to 10.

Figure 13:
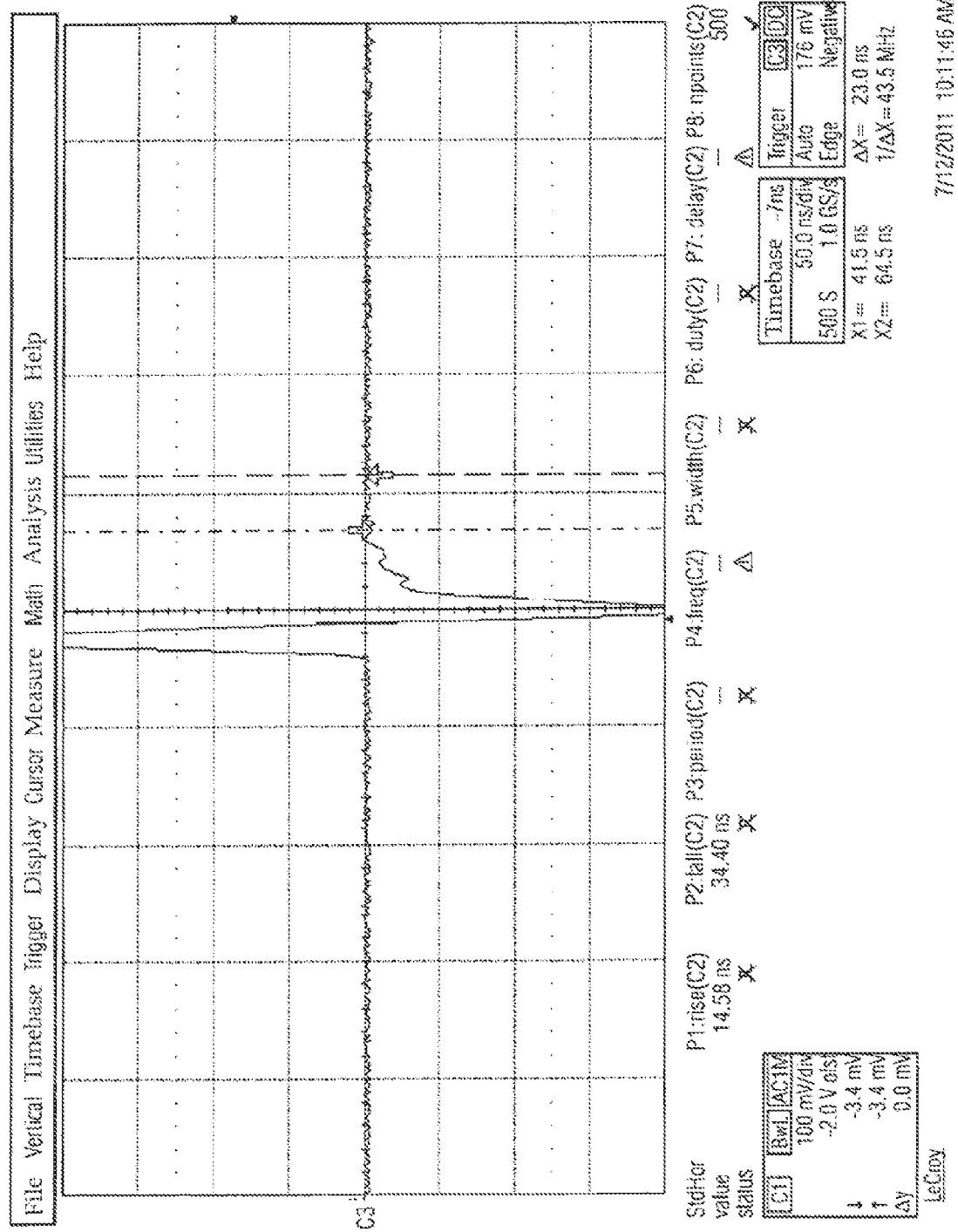
FIG. 13 a signal pattern of a free damped oscillation of an antenna coil with a conducting path break.

FIG. 13 shows the signal pattern of a free, damped oscillation of an antenna coil 20 which has a conducting path break. The self-resonant frequency of the coil, i.e. of the interrupted coil segments, is still recognizable. They are considerably elevated in comparison to the intact coil (cf. FIG. 9, FIG. 10).

Figure 14:
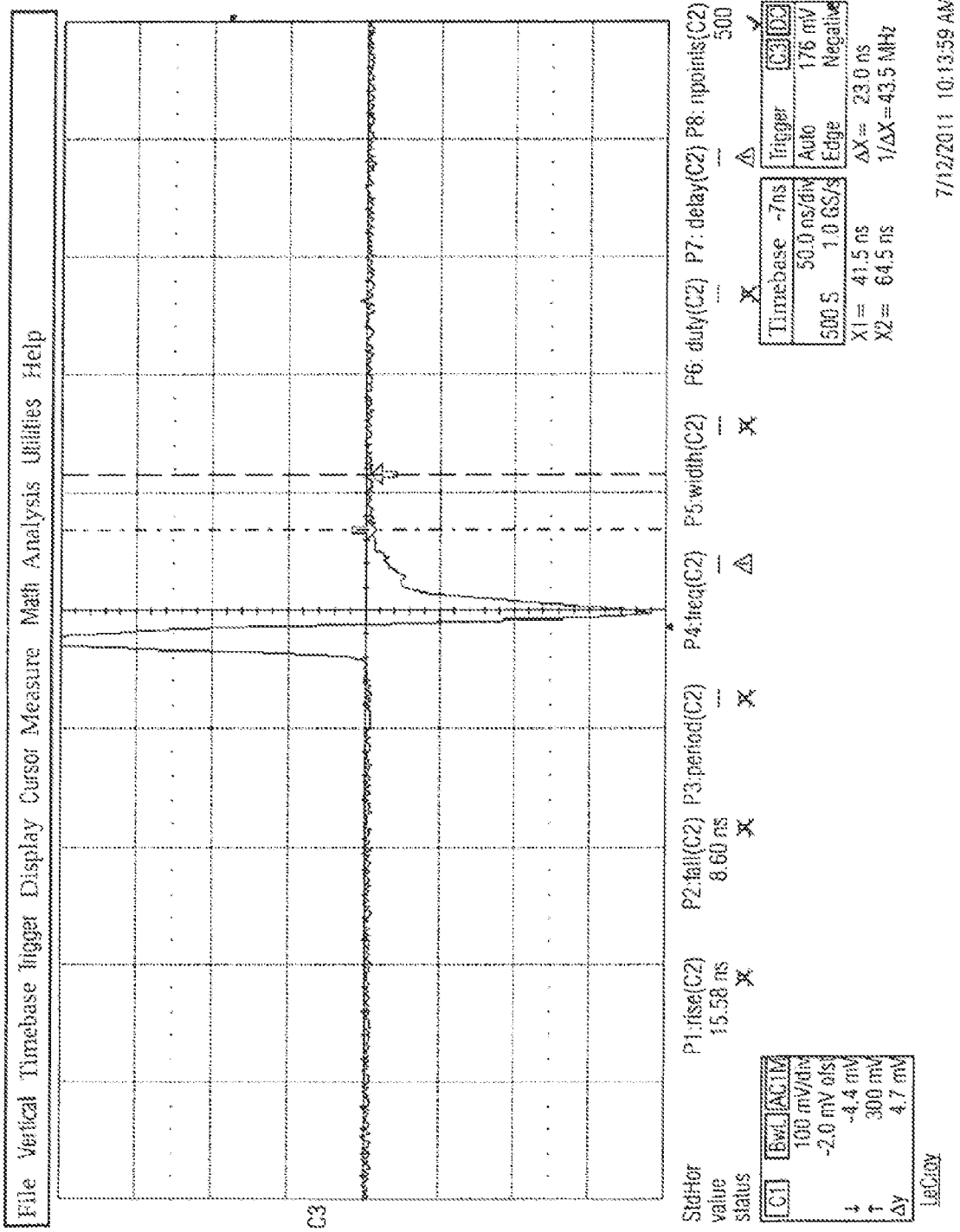
FIG. 14 a signal pattern of a free damped oscillation of an antenna coil with short-circuited coil turns.
Figure 15:
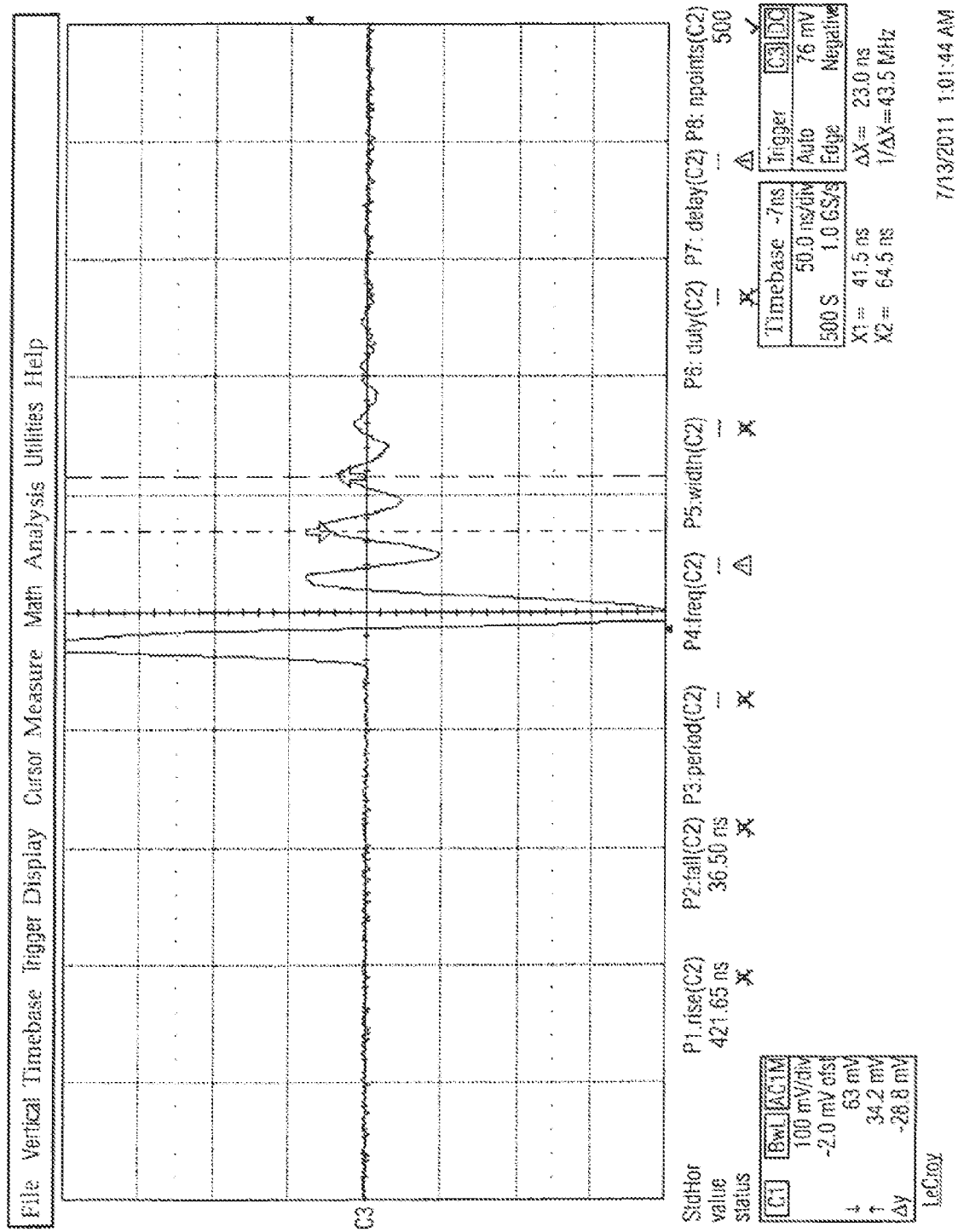
FIG. 15 a signal pattern of a free, damped oscillation of an intact antenna coil when exciting coil and measuring antenna are not disposed orthogonally to each other.

As to be seen with reference to FIG. 14, in the case of a short circuit of coil turns of the antenna coil 20 hardly any more dying out of the coil is to be recognized.

That is to say, the two primarily occurring faults of an antenna coil 20 to be checked, a conducting path break or a short circuit between coil turns, can be reliably recognized by detecting and evaluating a free, damped oscillation of the antenna coil occurring as a result of the excitation of the coil 20 by a pulse.

As mentioned above and illustrated again in FIG. 15, in the case that the exciting coil 130 and the measuring antenna 140 are not disposed orthogonally to each other, the Dirac pulse given in the exciting coil 130 is also detected by the measuring antenna 140. Moreover, the decay behavior of the exciting coil 130 is superimposed on the decay behavior of the antenna coil 20 that is properly to be detected by the measuring antenna 140.

Figure 16:
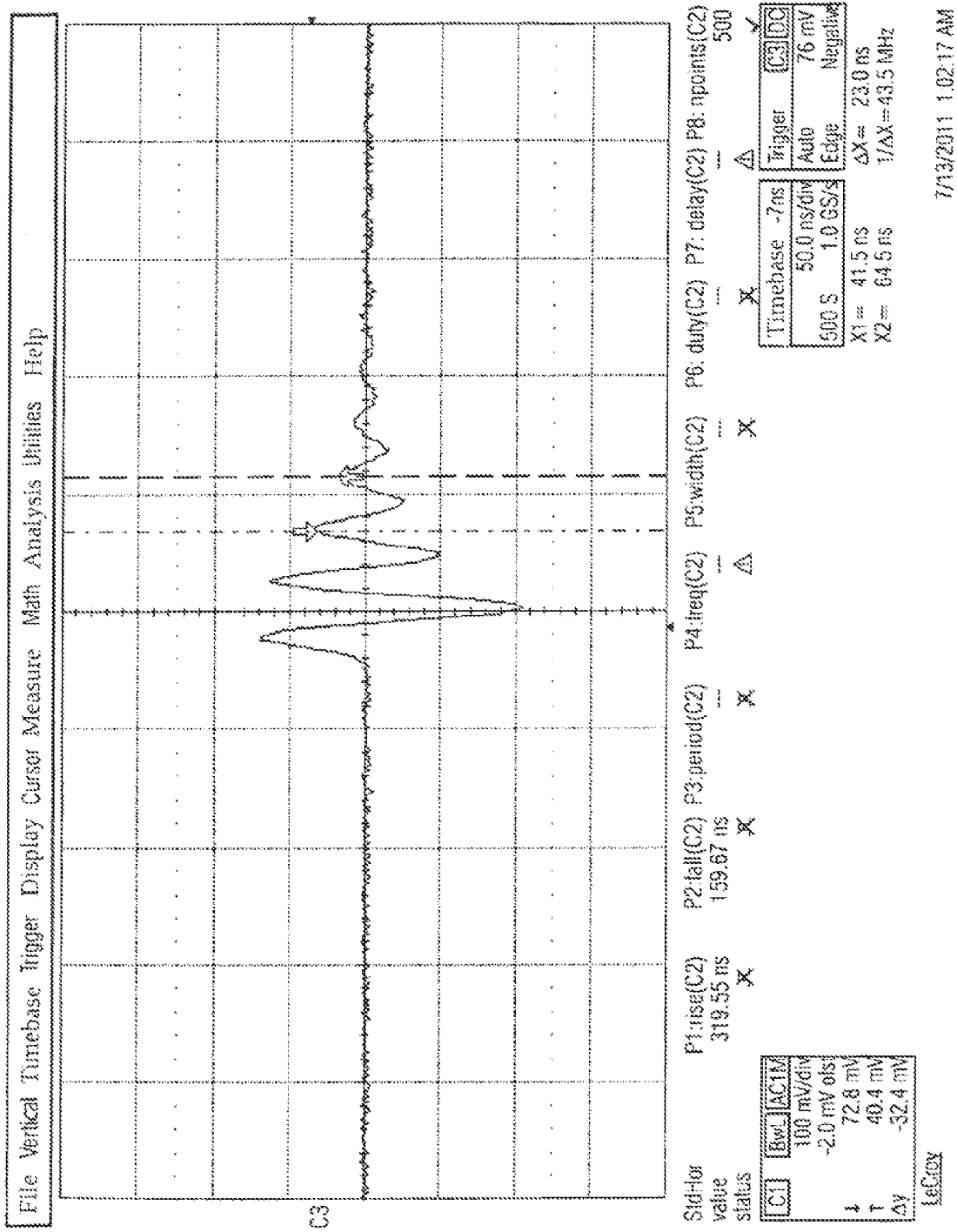
FIG. 16 a signal pattern of a free, damped oscillation of an intact antenna coil when exciting coil and measuring antenna are disposed orthogonally to each other.

When the exciting coil 130 and the measuring antenna 140 are disposed orthogonally to each other in the manner described hereinabove with reference to FIG. 4, the signal of the exciting coil 130 is practically not "seen" by the measuring antenna 140. FIG. 16 shows the same measurement as in FIG. 15, but with the measuring antennae 140 disposed orthogonally to the exciting coil 130. The Dirac pulse is no longer to be recognized here as a signal superimposed on the signal pattern.

Figure 17:
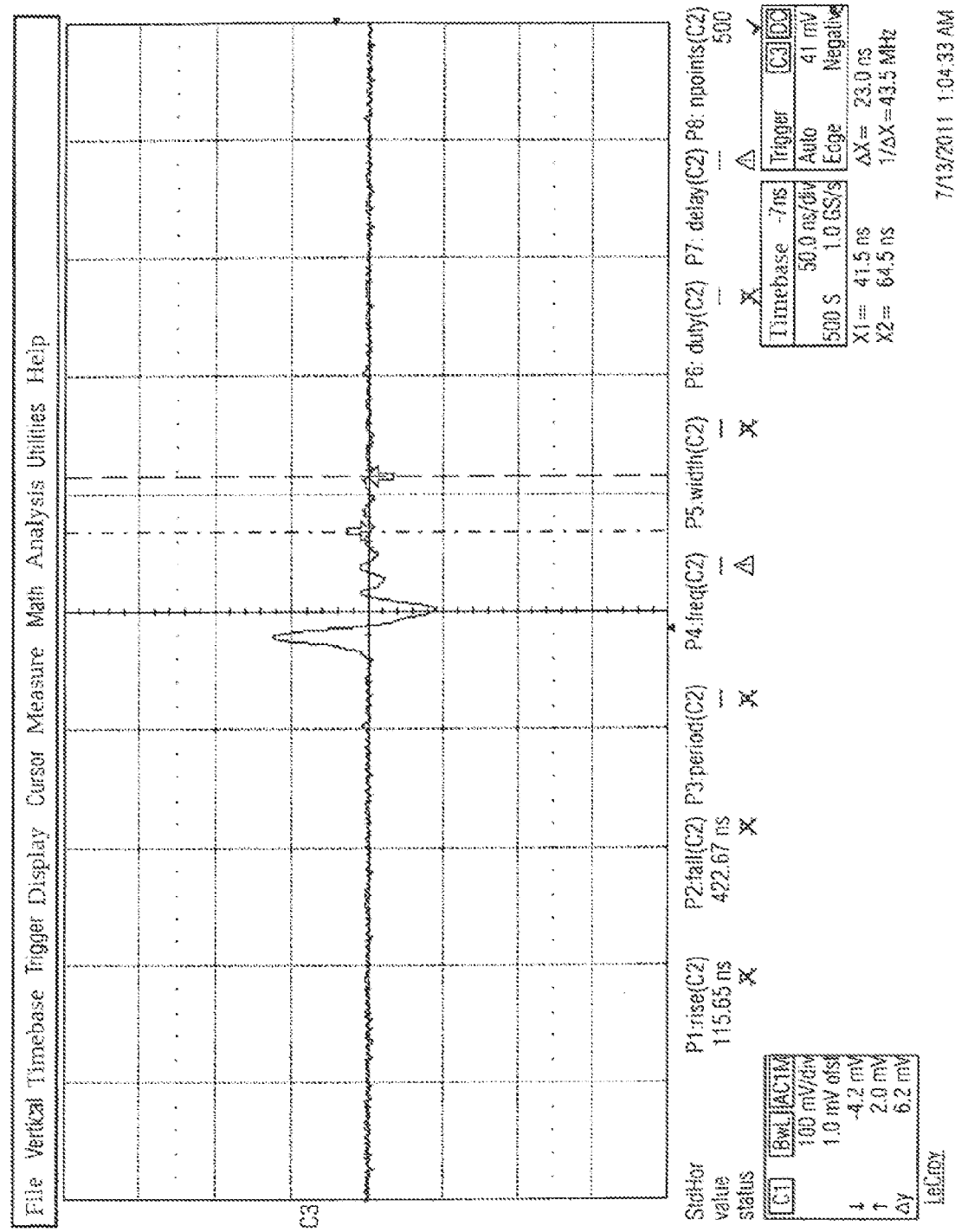
FIG. 17 a signal pattern of a free, damped oscillation of an antenna coil with a conducting path break when exciting coil and measuring antenna are disposed orthogonally to each other.

With such a measurement setup, the detection of a free damped oscillation of an antenna coil 20 with a conducting path break delivers a signal pattern as to be seen in FIG. 17.

Figure 18:
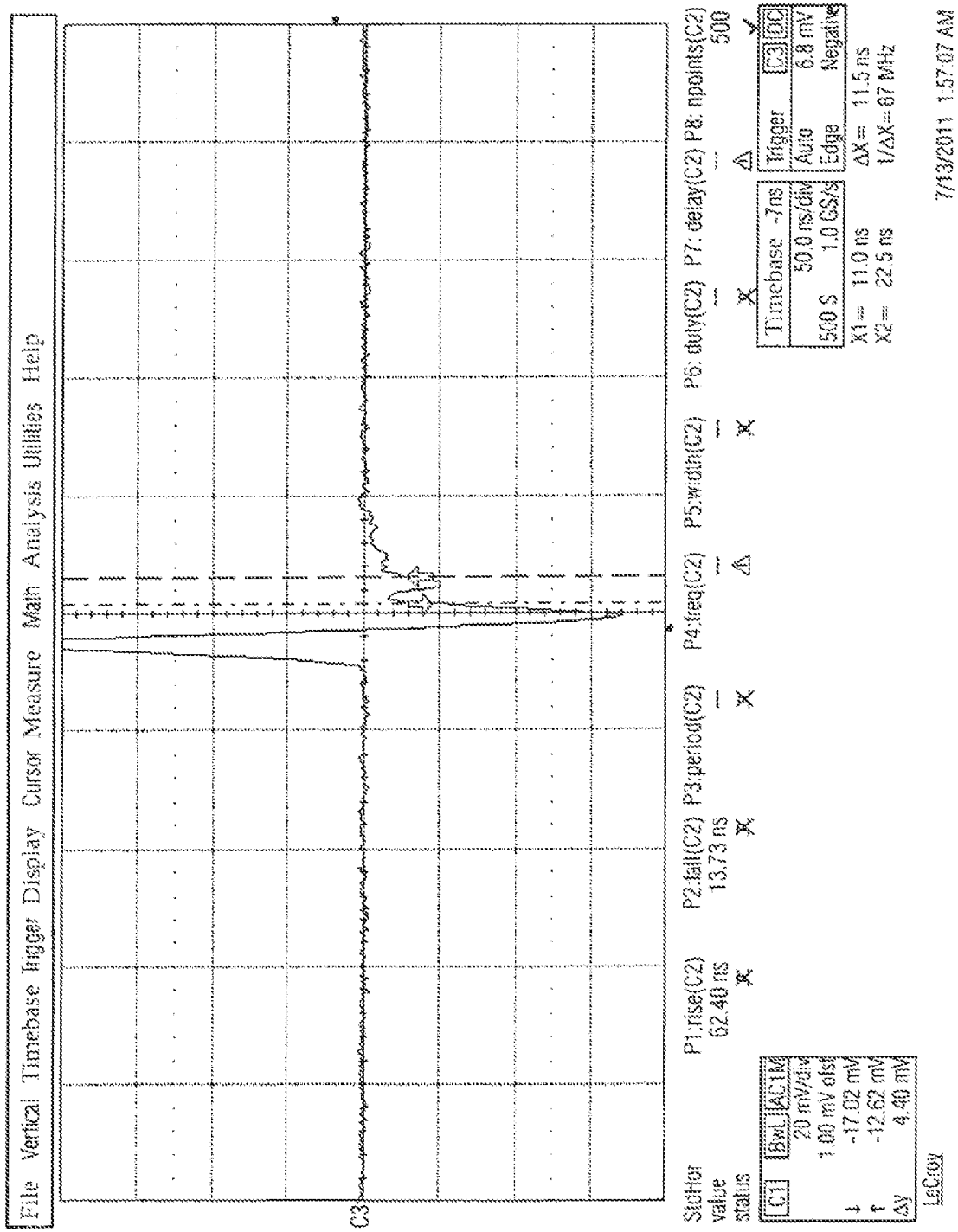
FIGS. 18, 19 a respective signal pattern of a free, damped oscillation of an antenna coil with a short circuit of two or three coil turns when exciting coil and measuring antenna are disposed orthogonally to each other.
Figure 19:
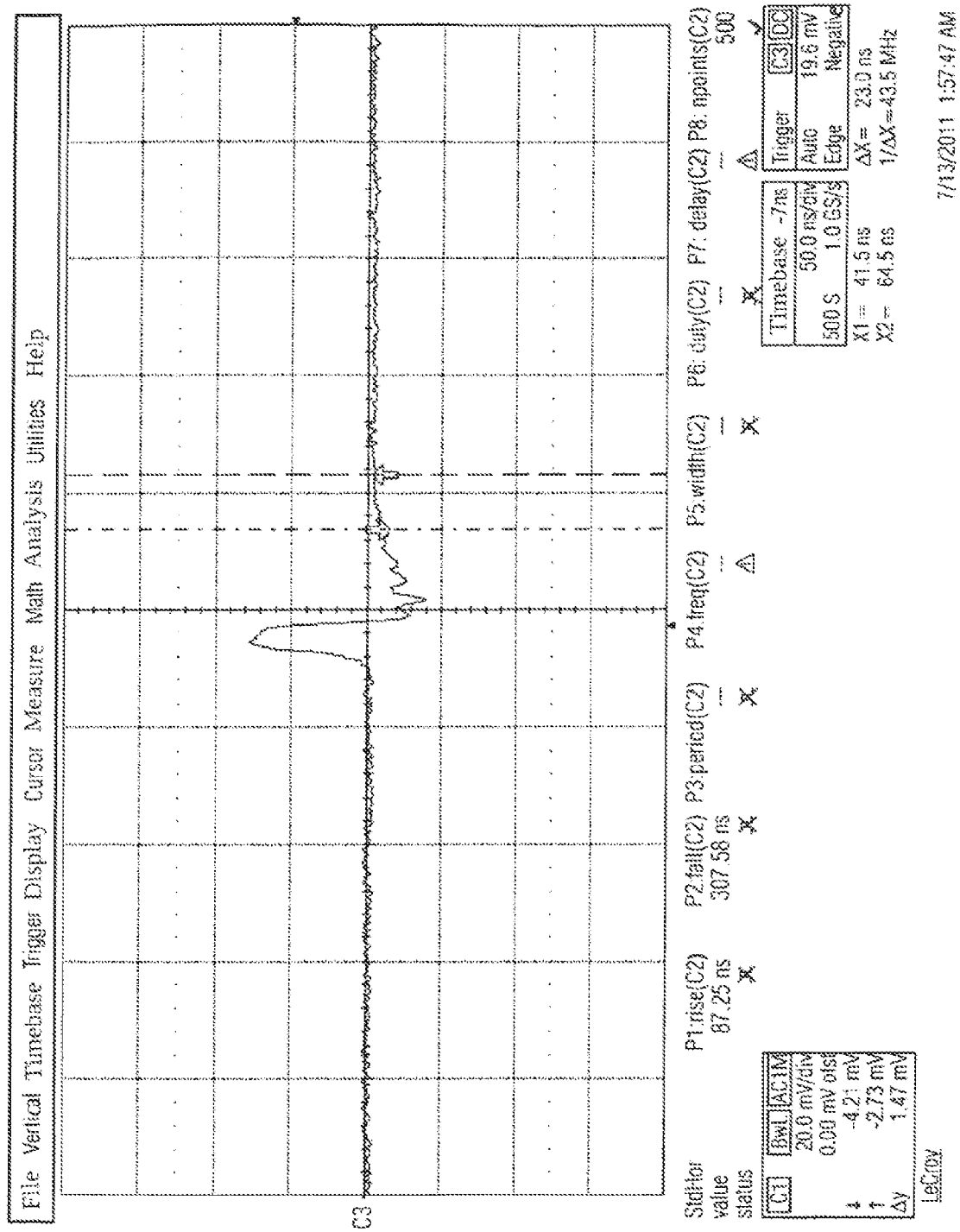

As to be seen with reference to FIGS. 18 and 19, this measurement setup also enables a conducting path short over two turns (FIG. 18) to be distinguished from a conducting path short over three turns (FIG. 19). The measured self-resonance of the coil with two short-circuited turns amounts to 87 MHz. In the case of three short-circuited turns, a self-resonance of even 125 MHz is determined. The elevation of the resonance frequency is to be ascribed here to a significant reduction of the coil inductance through the short-circuited conductor loop which is still inductively coupled to the remaining antenna coil.

The evaluation of the signals detected by means of the measuring antenna 140 can be carried out in different ways. According to a first embodiment, a digital signal processor (DSP) can be used for evaluation. In so doing, data sets of intact antenna coils are employed for verifying detected data. The DSP converts the measured signal by means of an A/D converter and tests the converted signal on the basis of stored reference values. Alternatively or additionally, the DSP can also establish the self-resonance of the antenna coil and test the dying-out voltage level.

Figure 20:
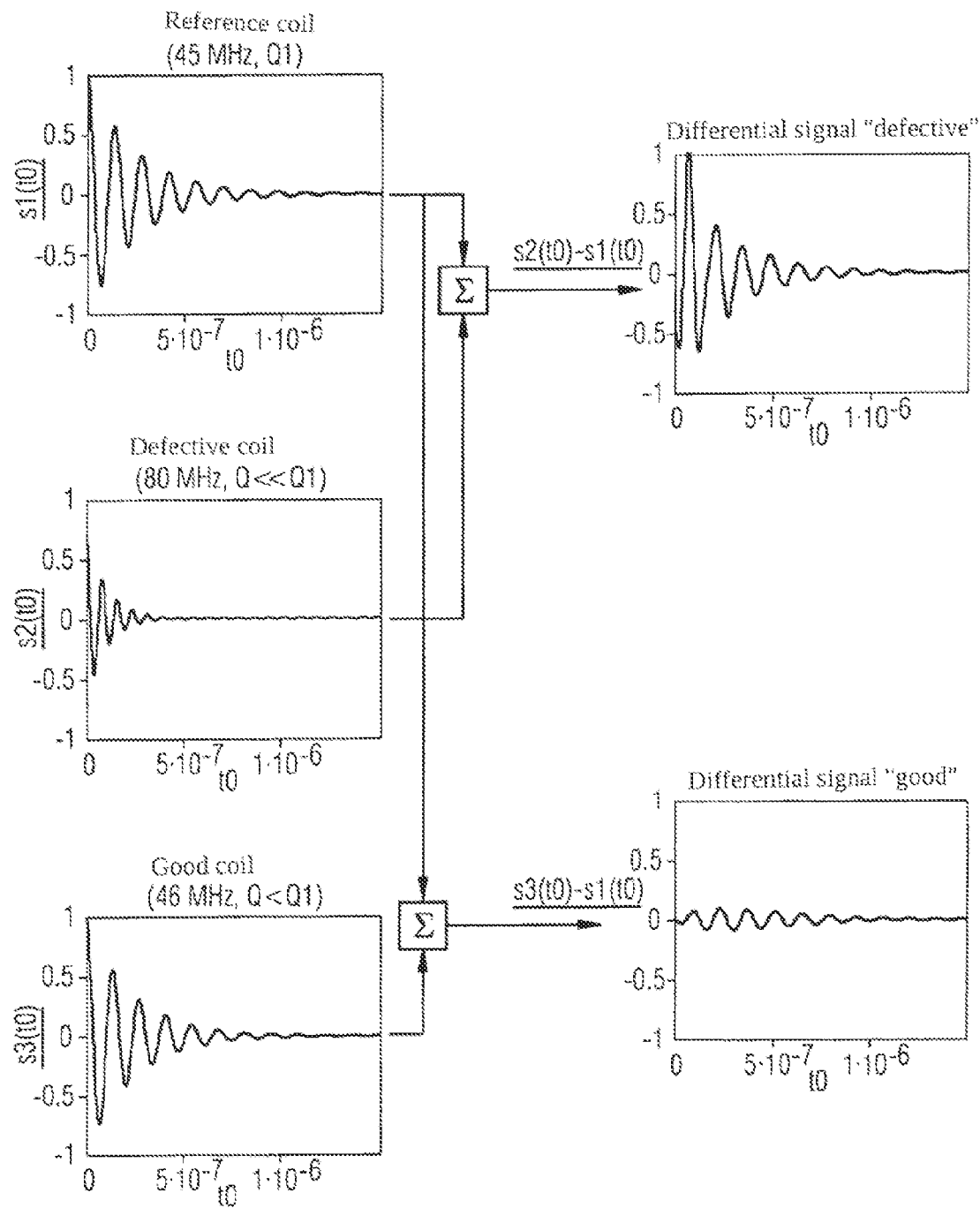
FIG. 20 a procedure for evaluating a detected free, damped oscillation.

According to a second embodiment on the basis of a reference coil, a parallel reference measurement is carried out with an antenna coil known to be intact. In this evaluation method it thus only necessary to determine the distance, the delta, between the signal detected for the antenna coil to be checked and the signal of the reference coil, as illustrated in FIG. 20. If this delta deviates too far from stipulated limiting values, the checked antenna coil is classified as faulty. A described delta formation of two signals can already be effected with a simple differential amplifier (comparator circuit) and subsequent peak detectors.

According to a third embodiment, an oscilloscope can evaluate the currently detected data on the basis of stored limiting values. With the mathematical functions normally provided by the oscilloscope, the self-resonance and the quality factor of the checked antenna coil can be determined automatically in a simple manner.

Figure 21:
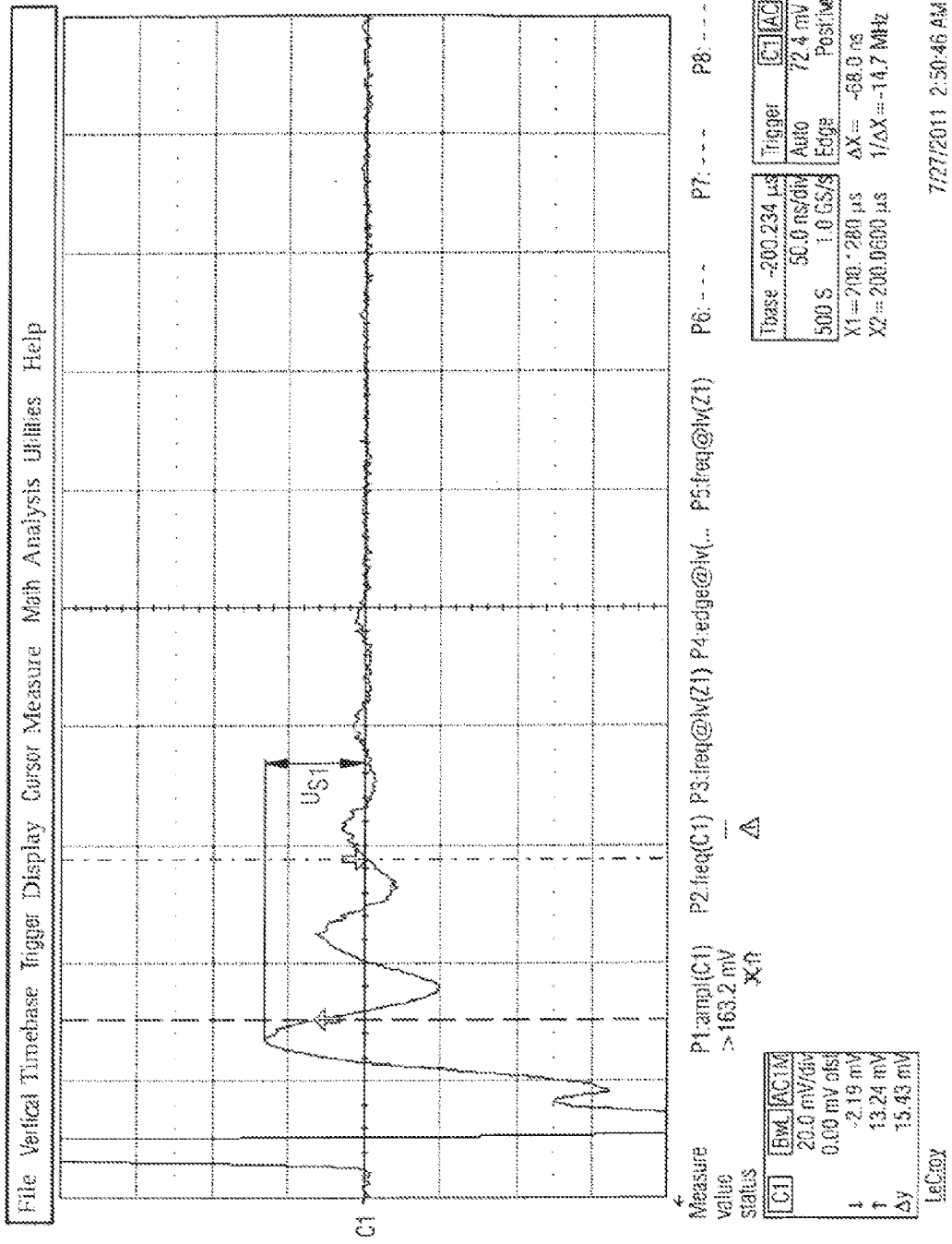
FIGS. 21, 22 the voltage pattern of a free, damped oscillation of two antenna coils with a deviating ohmic resistance.
Figure 22:
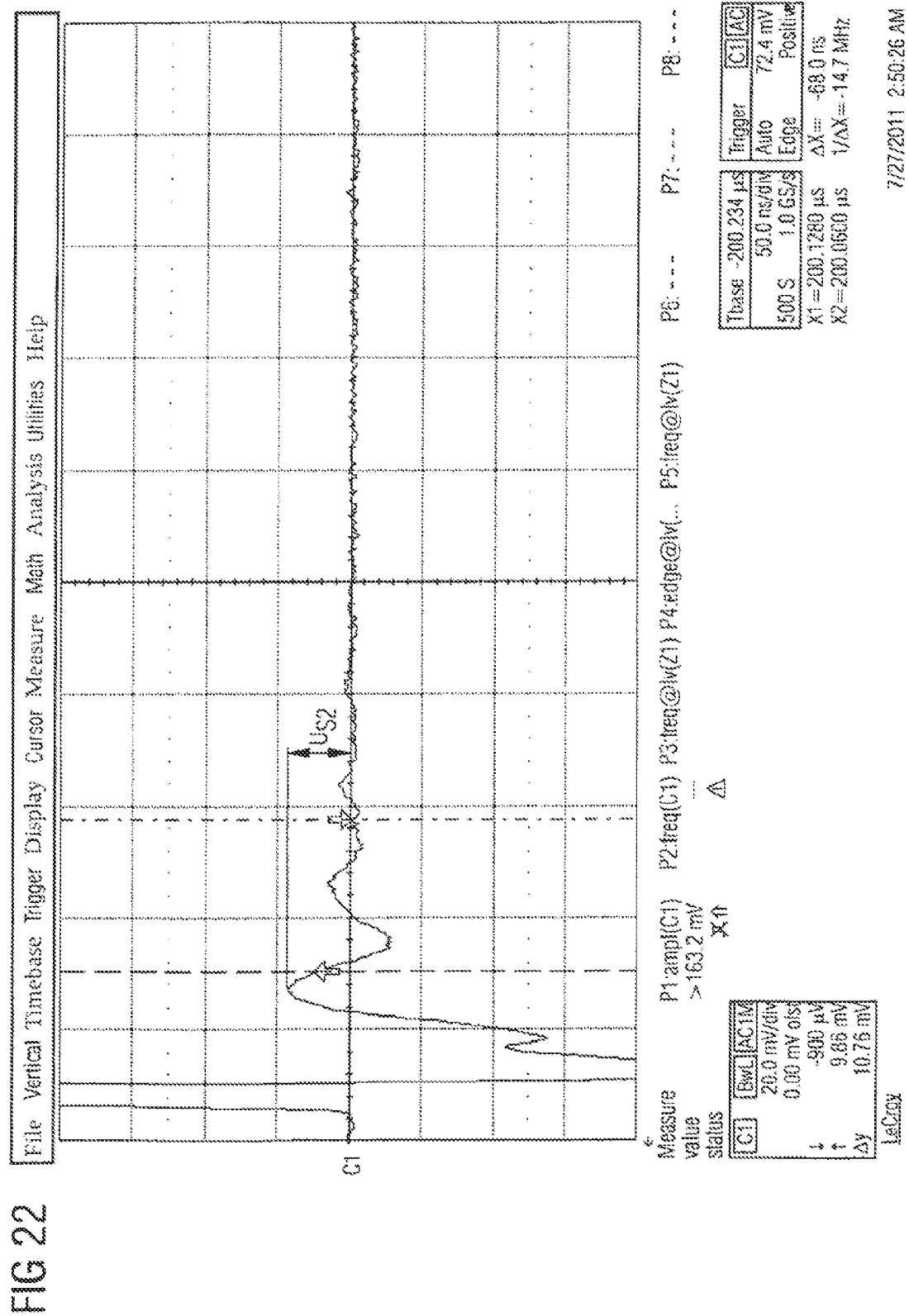

As represented in FIGS. 21 and 22, there is a unique relation between the voltage pattern, more precisely the detected peak voltage U of the pulse response of an antenna coil S, and its ohmic resistance R. FIG. 21 shows a measurement on an antenna coil S1 with a coil resistance $R_{S1}$ of 89 ohms. The coil resistance $R_{S2}$ of the antenna coil S2 for the measurement from FIG. 22 amounts to 108 ohms. More precisely, there appears, within the usual tolerances, a linear relation between these two quantities, i.e. when $U_{S1}$ and $U_{S2}$ designate the corresponding peak voltages detected for the coils S1 and S2, and $R_{S1}$ and $R_{S2}$ the ohmic resistances of the coils S1 and S2, it holds that: $U_{S1}/U_{S2}=R_{S2}/R_{S1}$. Thus it becomes possible, when for example the coil S1 is used as a known reference coil, to calculate the ohmic resistance $R_{S2}$ of a coil S2 to be checked, on the basis of the voltage ratio which is determined from $U_{S1}$ and the peak voltage $U_{S2}$ for the coil S2. This relation has been verified by contacted, ohmic measurement.

Due to the fact that the checking method according to the invention, as previously explained with reference to FIGS. 13 and 14 as well as 17 to 19, is able not only to distinguish between the intact antenna coils and those having a fabrication defect, but also to recognize different types of defects, the result of the checking method can be utilized effectively in the manufacturing process of the antenna coil.

Firstly, antenna coils recognized as defective can be sorted out. Secondly, it is also possible to use the results of the checking method both by way of feedback to adjust production parameters of the preceding antenna manufacture, and to carry out a differentiated post-processing of individual antenna coils, as will be described by way of example hereinafter with reference to FIGS. 23 and 24.

Figure 23:
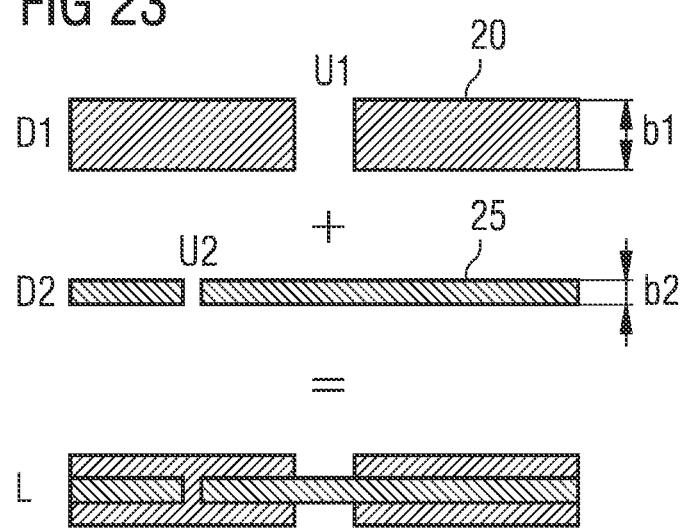
FIGS. 23, 24 steps in post-processing an antenna coil in dependence on a preceding check.

It was hitherto customary, for example, to print the conducting paths of the coils twice in order to avoid interruptions of printed antenna coils. In this way it is possible to exclude with high probability the case of an unwanted interruption remaining at the same place on the antenna coil upon each of the two printing operations—which would interrupt the conducting path as a whole. The general procedure is illustrated schematically in FIG. 23. FIG. 23 shows a small detail of the conducting path in plan view. In a first printing pass D1 the conducting path is printed with a width b1. As represented, it can happen that in so doing an unwanted interruption U1 arises. To close it, a second printing operation D2 is carried out. In so doing, a conducting path of smaller width b2 is normally printed on the conducting path already present. The resulting total structure is represented in the lower line in FIG. 23, designated as L. In the second printing operation, unwanted interruptions U2 can also arise, as represented. However, the probability of them lying within already existing interruptions U1 is very low. In this way it can be substantially ensured that a thus double-printed antenna coil has no conducting path break.

This procedure is very time-consuming as well as involving high material consumption.

The checking method according to the invention now delivers results that allow the described production process to be optimized. The number of antenna coils recognized as defective can be evaluated to the effect that the number of ascertained conducting path breaks and the number of recognized turn-to-turn short circuits are compared. A high number of conducting path breaks can indicate that for example the quantity of conductive paste employed for printing the conducting path should be increased. A great number of short circuits could suggest the opposite conclusion. On the basis of such an evaluation the corresponding production parameter is now adjusted until the corresponding fault count of the fault type decreases. The remaining faulty antenna coils can then still be post-processed, for example as described with reference to FIG. 23. In this way it is only necessary to post-process a small number of antenna coils and the consumption of material decreases considerably.

Figure 24:
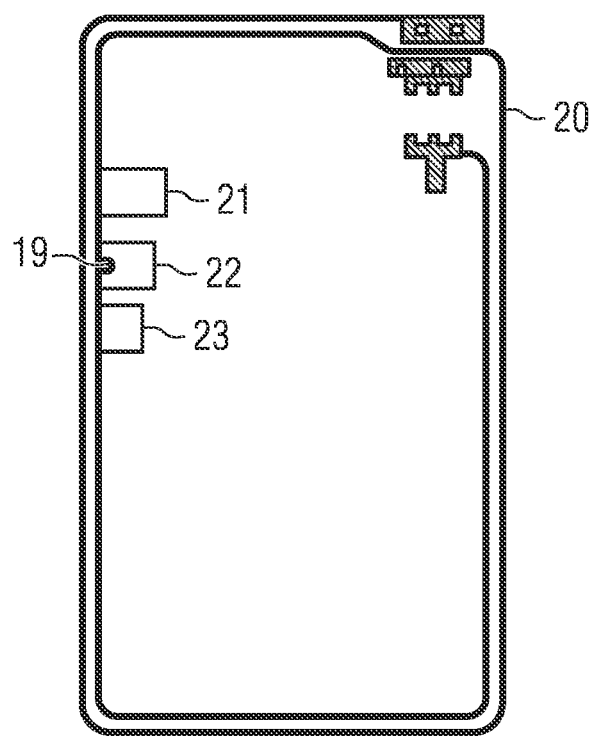

According to a further variant, it may be provided that upon a first printing of an antenna coil 20 additional antenna coil loops or bends 21, 22, 23 are printed, as represented in FIG. 24. These bends are at first still in a short-circuited state, thus being practically without effect in the alternating current circuit. They act neither as an additional impedance nor as an additional capacitance. By means of the checking method according to the invention it is now possible to determine the essential parameters of the antenna coil 20, in particular also its ohmic resistance (cf. the above remarks with reference to FIGS. 21 and 22).

In a further production step, depending on the value determined within the framework of the checking method, the resistance of the antenna coil can now be adjusted, if necessary, by "opening" one or more than one of the bends 21, 22, 23. This can be done for example by punching out, lasering out or removing in another suitable manner a part of a conducting path portion short-circuiting the bend, as indicated in FIG. 24 by the reference sign 29. In this way it is possible for example to manufacture antenna coils identically in a uniform and thus cost-efficient first production step, and to make adjustments to certain stipulations for different buyers, for example with regard to the ohmic resistance of the respective antenna coils, in a second production step.

The shown bends 21, 22, 23 can also be present in a different form, for example a meandering form. This has the further advantage that they remain without effect in the alternating current circuit after the short circuit of the respective bend is disconnected.

The invention claimed is:

1. A method for checking a functionality of an antenna coil for a contactlessly communicating portable data carrier, the method comprising the steps of:
    exciting the antenna coil to oscillate, wherein the antenna coil of the portable data carrier is inductively excited by only a single magnetic pulse;
    detecting an oscillation and an oscillation decay of the antenna coil induced by the single magnetic pulse; and
    determining the functionality of the antenna coil by evaluating the detected oscillation and oscillation decay of the antenna coil,
    wherein, upon the evaluation of the oscillation and the oscillation decay of the antenna coil, the resonance frequency of the antenna coil or a quality factor of the antenna coil is determined.

2. The method according to claim 1, wherein the antenna coil is excited inductively by the single magnetic pulse, the single magnetic pulse being generated by a single direct-current pulse.

3. The method according to claim 2, wherein the direct-current pulse is generated as a Dirac pulse or as a current pulse having only one steep edge.

4. The method according to claim 1, wherein the antenna coil is excited contactlessly by means of an external exciting coil, and that the oscillation and the oscillation decay are detected contactlessly by means of an external measuring antenna.

5. The method according to claim 4, wherein the exciting coil and the measuring antenna are disposed orthogonally to each other for checking the antenna coil.

6. The method according to claim 1, wherein upon the evaluation of the oscillation and the oscillation decay of the antenna coil, the nature of a defect of the antenna coil is ascertained.

7. The method according to claim 6, wherein, in dependence on the nature of the ascertained defect of the antenna coil, at least one production parameter for manufacturing the antenna coil is newly determined or the antenna coil recognized as faulty is post-processed in a further step.

8. The method according to claim 1, wherein an antenna coil without an integrated circuit attached or a transponder in the form of the antenna coil with an integrated circuit attached are checked.

9. The method according to claim 1, wherein the functionality of a closed antenna coil is checked and subsequently a conducting path of the antenna coil is interrupted for manufacturing an open antenna coil before the antenna coil is connected to components of an integrated circuit, in particular a chip.

10. A checking apparatus for checking the functionality of an antenna coil for a contactlessly communicating portable data carrier, the checking apparatus comprising:
    a pulse generator configured to contactlessly excite the antenna coil to oscillate by only a single magnetic pulse via an exciting coil attached to the pulse generator;
    a measuring antenna configured to contactlessly detect an oscillation and an oscillation decay of the antenna coil induced by the single magnetic pulse; and
    an evaluation device connected to the measuring antenna, the evaluation device being configured to determine the functionality of the antenna coil by evaluating the detected oscillation and oscillation decay detected by the measuring antenna,
    wherein, upon the evaluation of the oscillation and the oscillation decay of the antenna coil by the evaluation device, the resonance frequency of the antenna coil or a quality factor of the antenna coil is determined.

11. The checking apparatus according to claim 10, wherein the exciting coil and the measuring antenna are disposed orthogonally to each other.

12. An apparatus for manufacturing an antenna coil on a carrier material for a contactlessly communicating portable data carrier, the apparatus comprising:
    a device for manufacturing an antenna coil on the carrier material, and
    a checking apparatus for checking a functionality of the antenna coil for a contactlessly communicating portable data carrier, the checking apparatus being configured to check the functionality of the antenna coil by performing the steps of:

exciting the antenna coil to oscillate, wherein the antenna coil of the portable data carrier is inductively excited by only a single magnetic pulse;

detecting an oscillation and an oscillation decay of the antenna coil induced by the single magnetic pulse; and determining the functionality of the antenna coil by evaluating the detected oscillation and oscillation decay of the antenna coil, wherein, upon the evaluation of the oscillation and the oscillation decay of the antenna coil, the resonance frequency of the antenna coil or a quality factor of the antenna coil is determined.

13. The apparatus according to claim 12, wherein the checking apparatus of the checking device is arranged to newly determine at least one production parameter for manufacturing the antenna coil in dependence on the nature of an ascertained defect of the antenna coil.

14. The apparatus according to claim 12, wherein the apparatus is arranged to post-process, in a further step, the antenna coil ascertained as defective after the check of the antenna coil by the checking apparatus.

* * * * *